US012635207B2

(12) United States Patent
Chao et al.

(10) Patent No.: US 12,635,207 B2
(45) Date of Patent: May 19, 2026

(54) SEMICONDUCTOR DEVICES AND METHODS OF FABRICATING THE SAME

(71) Applicant: Taiwan Semiconductor Manufacturing Company Ltd., Hsinchu (TW)

(72) Inventors: Yi-Hsiang Chao, Hsinchu (TW); Peng-Hao Hsu, Hsinchu (TW); Yu-Shiuan Wang, Hsinchu (TW); Chi-Yuan Chen, Hsinchu (TW); Yu-Hsiang Liao, Hsinchu (TW); Chun-Hsien Huang, Hsinchu (TW); Hung-Chang Hsu, Hsinchu (TW); Wei-Jung Lin, Hsinchu (TW); Chih-Wei Chang, Hsinchu (TW); Ming-Hsing Tsai, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 356 days.

(21) Appl. No.: 18/360,588

(22) Filed: Jul. 27, 2023

(65) Prior Publication Data

US 2025/0040213 A1     Jan. 30, 2025

(51) Int. Cl.
H10D 64/01          (2025.01)
H10D 30/62          (2025.01)
(Continued)

(52) U.S. Cl.
CPC ......... H10D 64/01 (2025.01); H10D 30/6219 (2025.01); H10D 62/83 (2025.01); H10D 64/62 (2025.01); H10P 14/412 (2026.01)

(58) Field of Classification Search
CPC ........ H10D 64/01; H10D 64/62; H10D 62/83; H10D 30/6219; H10D 30/024;
(Continued)

(56) References Cited

U.S. PATENT DOCUMENTS

| | | | |
|---|---|---|---|
| 2019/0013314 A1* | 1/2019 | Choi | ................... H01L 23/5283 |
| 2020/0105593 A1* | 4/2020 | Wu | ..................... H10D 84/0158 |

FOREIGN PATENT DOCUMENTS

| | | |
|---|---|---|
| TW | 201913767 A | 4/2019 |
| TW | 202013605 A | 4/2020 |
| TW | 202320145 A | 5/2023 |

OTHER PUBLICATIONS

Office Action issued in connection with Taiwan Appl. No. 112143085 dated Jun. 14, 2024.

* cited by examiner

*Primary Examiner* — Monica D Harrison
(74) *Attorney, Agent, or Firm* — Foley & Lardner LLP

(57) ABSTRACT

A semiconductor structure includes a source/drain feature in the semiconductor layer. The semiconductor structure includes a dielectric layer over the source/drain feature. The semiconductor structure includes a silicide layer over the source/drain feature. The semiconductor structure includes a barrier layer over the silicide layer. The semiconductor structure includes a seed layer over the barrier layer. The semiconductor structure includes a metal layer between a sidewall of the seed layer and a sidewall of the dielectric layer, a sidewall of each of the silicide layer, the barrier layer, and the metal layer directly contacting the sidewall of the dielectric layer. The semiconductor structure includes a source/drain contact over the seed layer.

20 Claims, 29 Drawing Sheets

(51) Int. Cl.
  *H10D 62/83* (2025.01)
  *H10D 64/62* (2025.01)
  *H10P 14/40* (2026.01)

(58) Field of Classification Search
  CPC .... H10D 30/62; H10D 64/251; H10D 30/019;
          H10D 30/501; H01L 21/32051; H01L
            21/28518; H01L 21/76843; H01L
          21/76855; H01L 23/485; H10P 14/412
  USPC ......................................................... 257/384
  See application file for complete search history.

100

112D

110

120

B 108
112S

A

104

102

106

106

A

B

Z

Y

X

Provide a substrate ～202

Form a fin protruding from the substrate ～204

Form isolation regions ～206

Form a dummy gate structure ～208

Form a source/drain feature over the fin ～210

Form an ILD layer ～212

Replace the dummy gate structure with a metal gate structure ～214

Form a source/drain contact ～216

Perform additional operations ～218

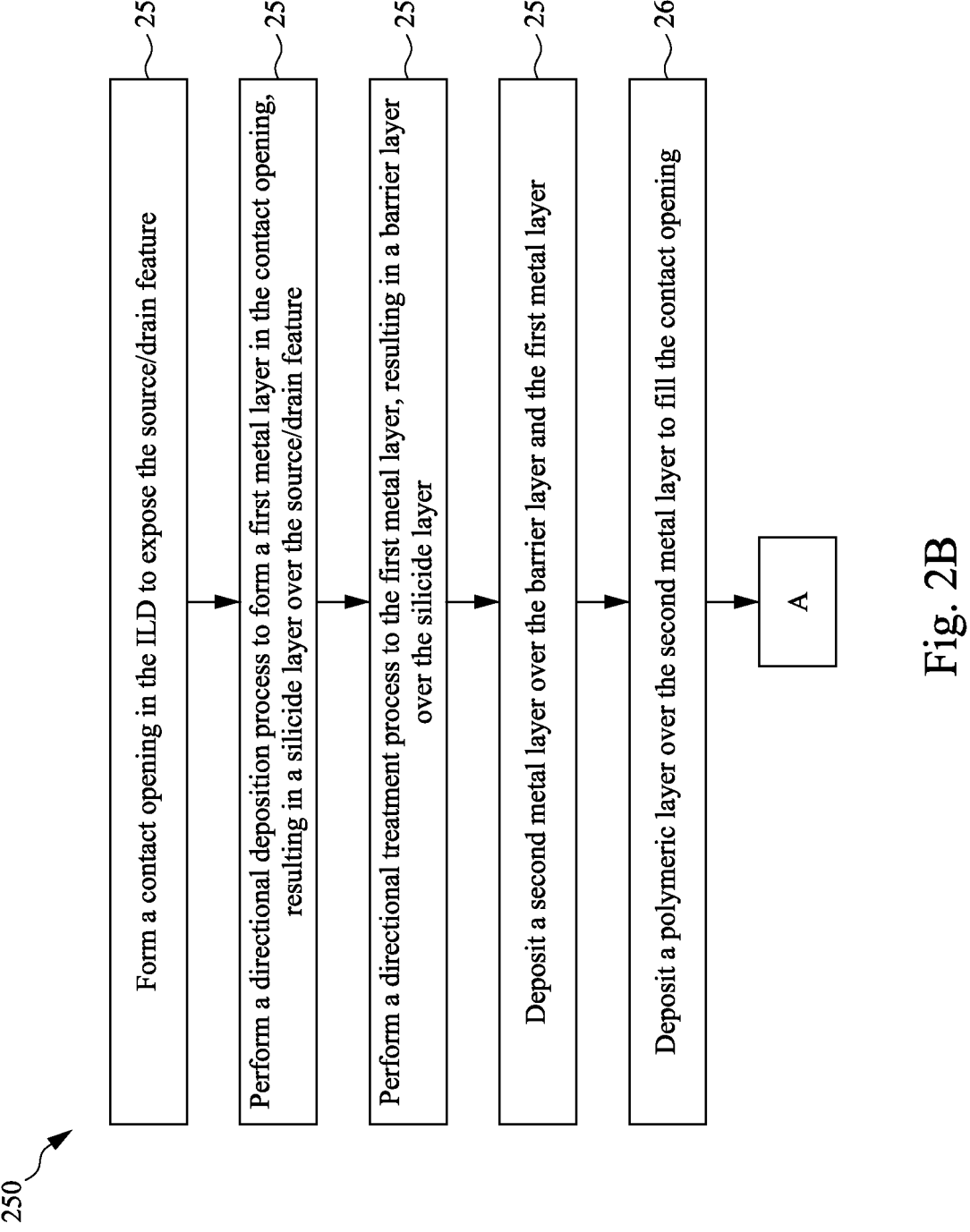

252 Form a contact opening in the ILD to expose the source/drain feature

254 Perform a directional deposition process to form a first metal layer in the contact opening, resulting in a silicide layer over the source/drain feature 256 Perform a directional treatment process to the first metal layer, resulting in a barrier layer over the silicide layer 258 Deposit a second metal layer over the barrier layer and the first metal layer 260 Deposit a polymeric layer over the second metal layer to fill the contact opening

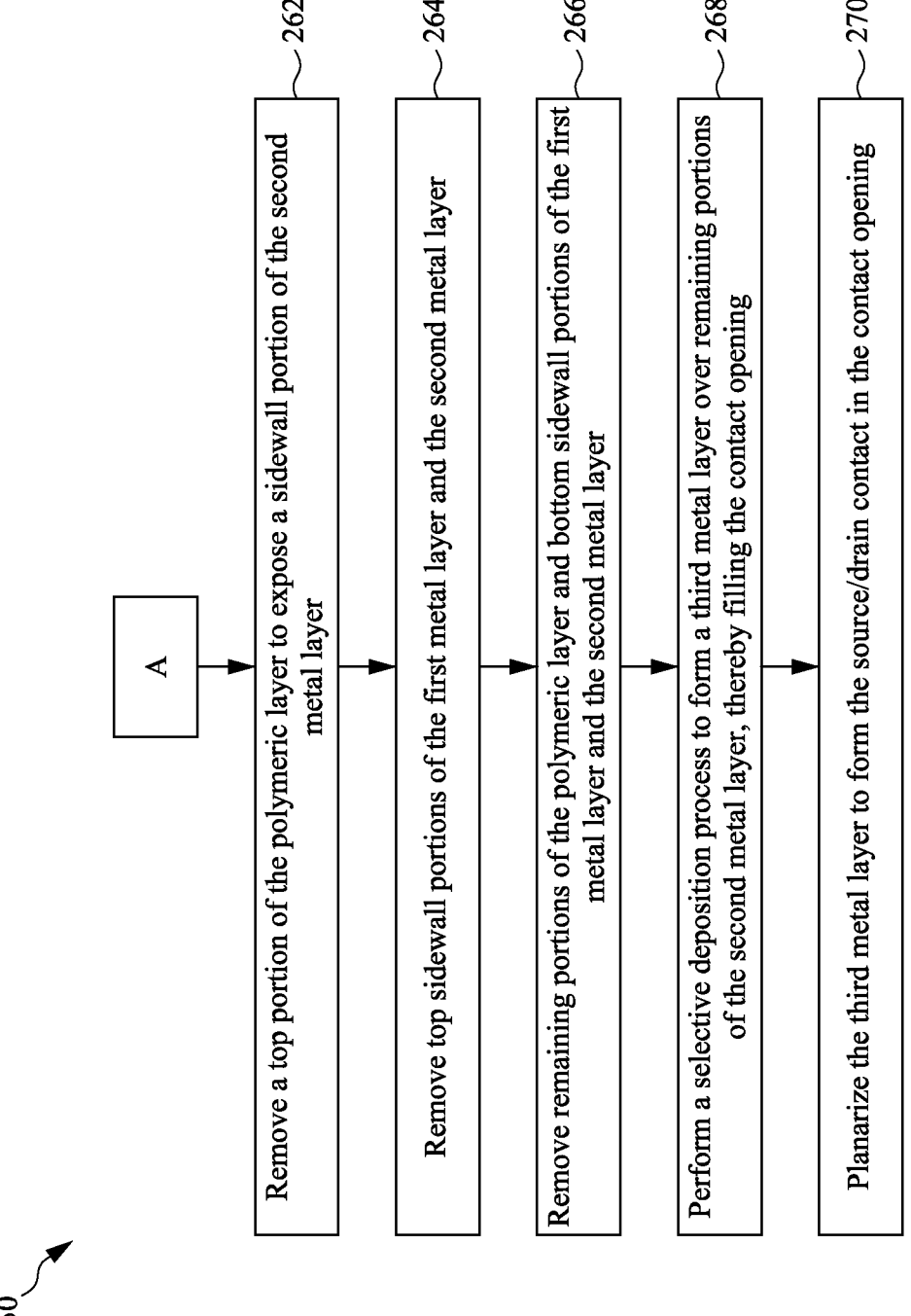

250

A

Remove a top portion of the polymeric layer to expose a sidewall portion of the second metal layer    262

Remove top sidewall portions of the first metal layer and the second metal layer    264

Remove remaining portions of the polymeric layer and bottom sidewall portions of the first metal layer and the second metal layer    266

Perform a selective deposition process to form a third metal layer over remaining portions of the second metal layer, thereby filling the contact opening    268

Planarize the third metal layer to form the source/drain contact in the contact opening    270

Fig. 2C

SEMICONDUCTOR DEVICES AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, reducing structural defects (e.g., voids) and contact resistance in source/drain contacts has become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B and 2C collectively illustrate a flow chart of an example method for implementing a portion of the example method of FIG. 2A, in accordance with some embodiments of the present disclosure.

DETAILED DESCRIPTION

Figure 1:
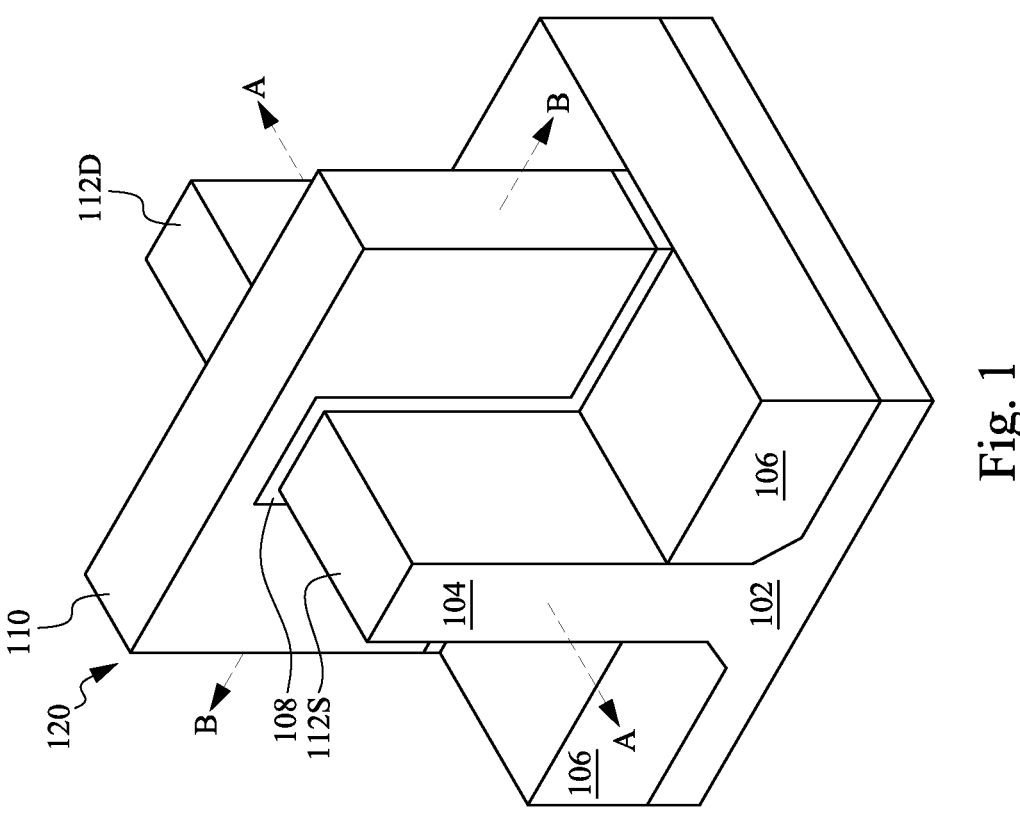
FIG. 1 illustrates a three-dimensional perspective view of an example semiconductor device (e.g., a fin-like field effect transistor, or FinFET), in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the terms "about" and "approximately" generally mean plus or minus 10% of the stated value. For example, about 0.5 would include 0.45 and 0.55, about 10 would include 9 to 11, about 1000 would include 900 to 1100.

FIG. 1 illustrates a perspective view of an example non-planar semiconductor device (hereafter referred to as device) 100, such as a FinFET or a multi-gate transistor (e.g., a gate-all-around, or GAA, transistor, a vertical multi-gate transistor, etc.), in accordance with various embodiments. The device 100 includes a substrate 102 and a fin 104 protruding above the substrate 102. Isolation regions 106 are formed on opposing sides of the fin 104, with the fin 104 protruding above the isolation regions 106. A gate dielectric layer 108 traverses a channel region of the fin 104, such that it is formed along sidewalls and over a top surface of the fin 104, and a gate electrode 110 is over the gate dielectric layer 108, which together form a gate structure 120. Source/drain regions 112D and 112S (over which source/drain features, not depicted, are formed) are disposed in and over the fin 104 and on opposing sides of the gate dielectric layer 108 and the gate electrode 110. The source/drain regions 112D and 112S extend outward from the gate electrode 110. FIG. 1 is provided as a reference to illustrate a number of cross-sections in subsequent figures. For example, cross-sections illustrated in FIGS. 3, 5, 11, and 13 are taken along line B-B (i.e., along the Y axis), which extends along a longitudinal axis of the gate structure 120 of the device 100. Cross-sections illustrated in FIGS. 4, 8, 10, 12, 14, 17, 19, 21, 23, 25, 27, 29, 31, 33, and 34 are taken along line A-A (i.e., along the X axis), which extends along a longitudinal axis of the fin 104 and in a direction of, for example, a current flow across the channel region of the fin 104 between the source/drain regions 112S/112D. Cross-sections illustrated in FIGS. 6, 7, 9, 15, 16, 18, 20, 22, 24, 26, 28, 30, 32,

35, and 36 are taken along line C-C (i.e., along the Y axis), which extends parallel to a longitudinal axis of the gate structure 120 and through the source/drain regions 112S/112D. Subsequent figures refer to these reference cross-sections for clarity.

Figure 2A:
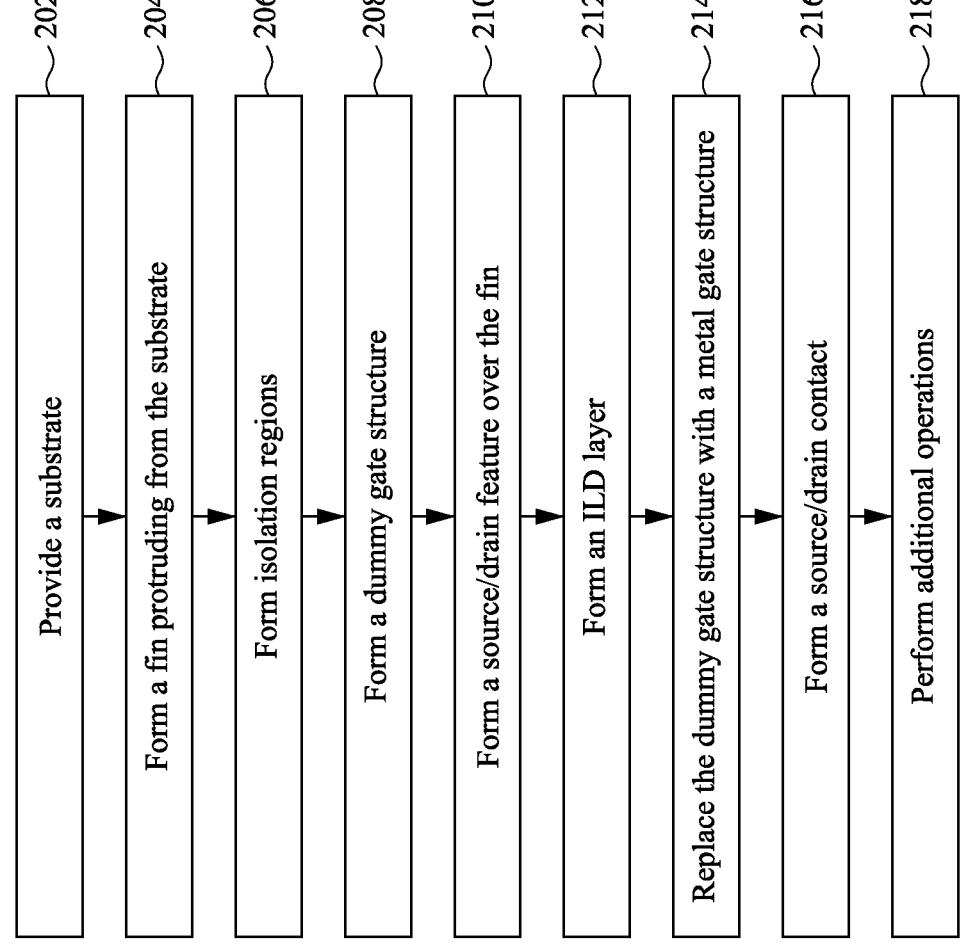
FIG. 2A illustrates a flow chart of an example method for making an example semiconductor device, in accordance with some embodiments of the present disclosure.
Figure 2A:
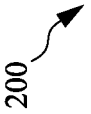

FIG. 2A illustrates a flowchart of a method 200 to form a non-planar semiconductor device, according to one or more embodiments of the present disclosure. For example, at least some of the operations of the method 200 can be used to form a FinFET, a multi-gate transistor (e.g., a GAA transistor, a vertical transistor, etc.) including a nanosheet transistor or a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2A, and that some other operations may only be briefly described herein. In some embodiments, operations of the method 200 may be associated with cross-sectional views of an example FinFET device 300 (hereafter referred to as device 300) at various fabrication stages as shown in FIGS. 3-36, which will be discussed in further detail below. FIGS. 2B and 2C collectively illustrate a flowchart of a method 250 to form a portion of the device 300, according to one or more embodiments of the present disclosure. Furthermore, embodiments of the device 300 are not limited to those depicted herein. For example, the device 300 may include a number of other devices such as inductors, fuses, capacitors, coils, etc., which are not shown herein for purposes of clarity.

Figure 3:
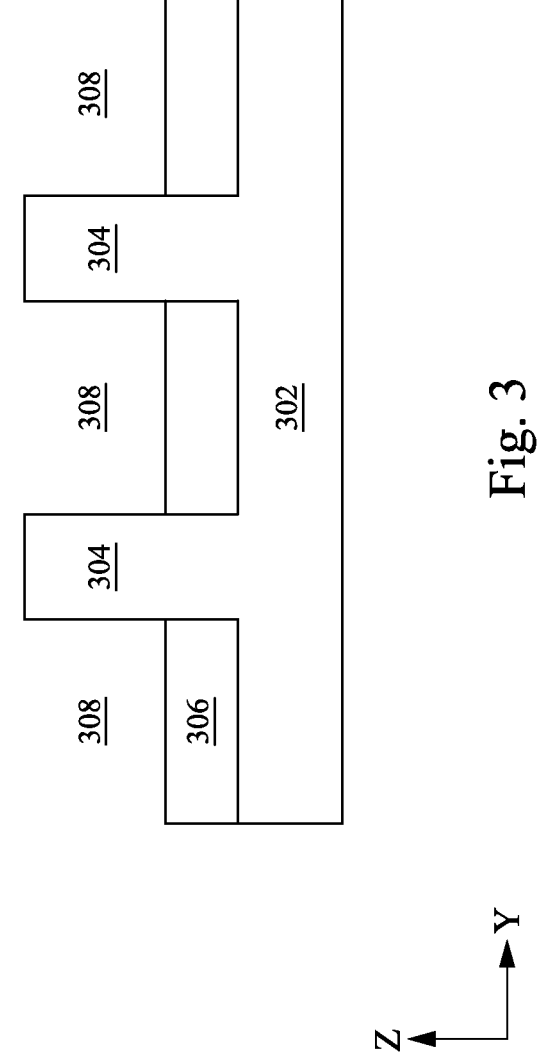
FIGS. 3, 5, 11, and 13 illustrate cross-sectional views of an example semiconductor device, or a portion thereof, analogous to the example semiconductor device of FIG. 1 along line B-B during various fabrication stages of the example method of FIG. 2A, in accordance with some embodiments of the present disclosure.

Referring to FIGS. 2A and 3, the method 200 at operation 202 provides a substrate 302 of the device 300. The substrate 302 may be a semiconductor substrate, such as a bulk semiconductor, a semiconductor-on-insulator (SOI) substrate, or the like, which may be doped (e.g., with a P-type or an N-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Still referring to FIGS. 2A and 3, the method 200 at operation 204 forms a (semiconductor) fin 304 to protrude or extend vertically from the substrate 302. The fin 304 may be more generically referred to as a semiconductor layer protruding from the substrate 302. Although two fins 304 are shown in the illustrated embodiment of FIG. 3 (and the subsequent figures), it should be appreciated that the device 300 can include any number of the fins 304 while remaining within the scope of the present disclosure. In some embodiments, the fins 304 are formed by patterning the substrate 302 using, for example, photolithography and etching techniques. For example, a mask layer (not depicted), including a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbonitride, the like, or combinations thereof. The pad oxide layer and the pad nitride layer may each be formed using low-pressure chemical vapor deposition (LPCVD) or plasma enhanced-chemical vapor deposition (PECVD), for example.

The mask layer may be patterned using photolithography techniques. Generally, photolithography techniques utilize a photoresist material (not depicted) that is deposited, irradiated (or exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask, which is subsequently used to pattern exposed portions of the substrate 302 to form trenches 308, thereby defining the fins 304 separated by the trenches 308 as depicted in FIG. 3. When multiple fins are formed, such a trench 308 may be disposed between any two adjacent fins 304. In some embodiments, the fins 304 are formed by etching the trenches 308 in the substrate 302 using, for example, reactive ion etch (RIE), neutral beam etch (NBE), the like, or combinations thereof. The etching may be anisotropically implemented. In some embodiments, the trenches 308 may be strips (viewed from the top) parallel to each other, and closely spaced with respect to each other. In some embodiments, the trenches 308 may be continuous and surround each fin 304. In this regard, though not depicted herein, a top surface of the resulting fins 304 is overlaid with the patterned mask until a subsequent fabrication step removes it.

The fins 304 may be patterned by other suitable methods. In one example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not depicted) is formed over the substrate 302 and patterned using a photolithography process. Spacers (not depicted) are formed alongside the patterned sacrificial layer using a self-aligned process. The sacrificial layer is then removed, and the remaining spacers, or mandrels, may then be used to pattern the fins 304.

In another example, a top portion of the substrate 302 may be replaced by or overlaid with a suitable material, such as an epitaxial material (not depicted) suitable for an intended type (e.g., N-type or P-type) of semiconductor devices to be formed. The epitaxial material may be grown over the substrate 302 by any suitable epitaxial process. Thereafter, the substrate 302, with the epitaxial material provided over the top portion, is patterned by a photolithography process described herein, for example, to form the fins 304 that include the epitaxial material.

Still referring to FIGS. 2A and 3, the method 200 at operation 206 forms isolation regions 306 over the substrate 302 to surround bottom portions of the fins 304. The isolation regions 306, which are formed of a dielectric (or insulating) material, can electrically isolate neighboring fins 304 from one another. The dielectric material may include an oxide, such as silicon oxide (SiO and/or $SiO_2$), a nitride, the like, or combinations thereof, and may be formed by a high density plasma chemical vapor deposition (HDPCVD), a flowable CVD (FCVD) (e.g., a CVD-based material deposition in a remote plasma system, followed by an annealing or curing process to densify the deposited material into another material, such as an oxide), spin coating, the like, or combinations thereof. Other dielectric materials and/or other formation processes may be used to form the isolation regions 306. In the depicted embodiments, the dielectric material of the isolation regions 306 include silicon oxide formed by a FCVD process. An annealing process may be performed once the dielectric material is deposited. A planarization process, such as a chemical-mechanical polish/planarization (CMP) process, may remove any excess dielectric material, such that a top surface of the dielectric material and the top surface of the fins 304 that are substantially coplanar. The patterned mask over the top surface of the fins 304 may also be removed by the planarization process.

Subsequently, the dielectric material is recessed to form the isolation regions 306 in the trenches 308, as depicted in FIG. 3. In some embodiments, the isolation regions 306 include shallow trench isolation (STI) features. The isolation regions 306 are recessed such that the upper portions of the fin 304 protrude from between neighboring isolation regions 306. Respective top surfaces of the isolation regions 306 may have a flat surface (as depicted), a convex surface, a concave surface (such as dishing), or combinations thereof. The top surfaces of the isolation regions 306 may be formed such profile(s) by any suitable etching process, such as one that is selective to the material of the isolation regions 306 with respect to the substrate 302 (and the fins 304). For example, a dry etching process or a wet etching process using dilute hydrofluoric (DHF) acid may be performed to recess the dielectric material to form the isolation regions 306.

As another example of forming the fins 304 and the isolation regions 306, a dielectric layer (not depicted) may be formed over the top surface of the substrate 302; trenches may be etched through the dielectric layer; homoepitaxial structures may be epitaxially grown in the trenches; and the dielectric layer may be recessed such that the homoepitaxial structures protrude from the dielectric layer to form the fins 304. In yet another example, a dielectric layer (not depicted) may be formed over the top surface of the substrate 302; trenches may be etched through the dielectric layer; heteroepitaxial structures may be epitaxially grown in the trenches using a material different from the substrate 302; and the dielectric layer may be recessed such that the heteroepitaxial structures protrude from the dielectric layer to form the fins 304.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an N-type device region (e.g., a region configured to provide an N-type metal oxide-semiconductor, or NMOS, device) different from the material in a P-type device region (e.g., a region configured to provide a P-type MOS, or PMOS, device). In various embodiments, the fins 304 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InA-lAs, GaSb, AlSb, AlP, GaP, and the like.

Figure 4:
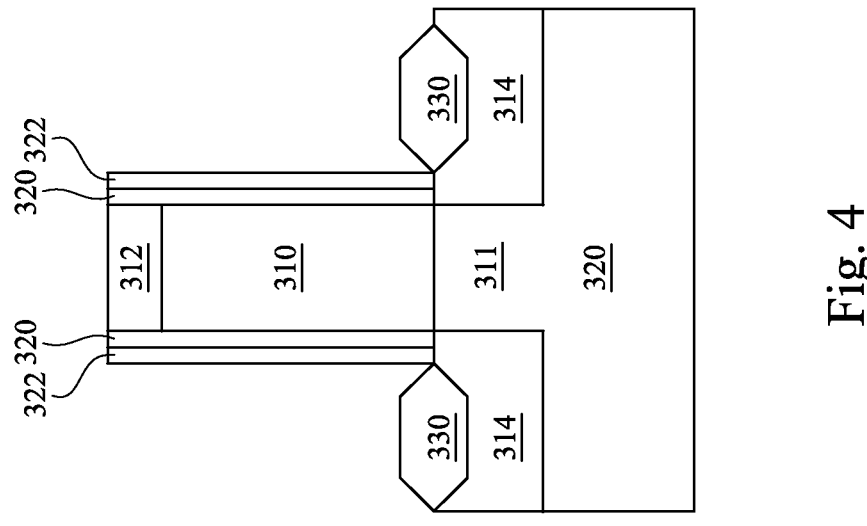
FIGS. 4, 8, 10, 12, 14, 17, 19, 21, 23, 25, 27, 29, 31, 33, and 34 illustrate cross-sectional views of an example semiconductor device, or a portion thereof, analogous to the example semiconductor device of FIG. 1 along line A-A during various fabrication stages of the example method of FIGS. 2A and/or 2B-2C, in accordance with some embodiments of the present disclosure.
Figure 5:
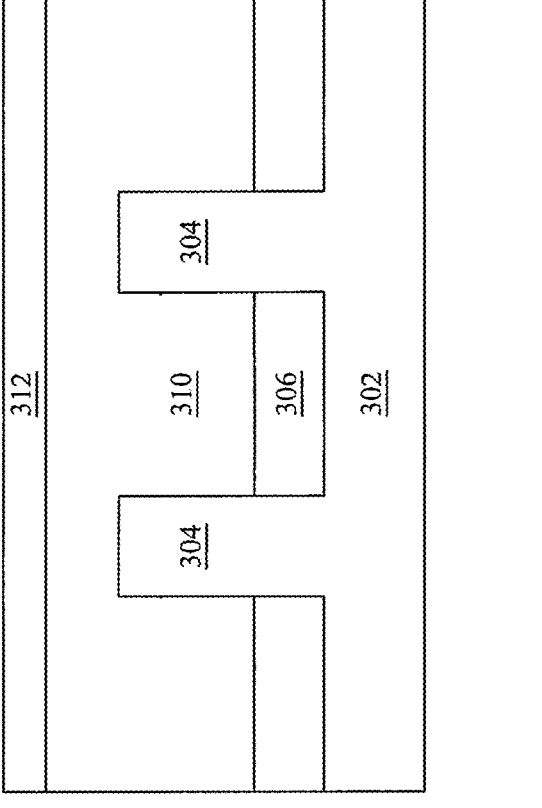
Figure 5:
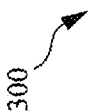
Figure 5:
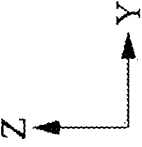

Referring to FIGS. 2A, 4, and 5, the method 200 at operation 208 forms a dummy gate structure 310 over a channel region 311 of the fin 304. It should be appreciated that additional dummy gate structures 310 can be formed over the fins 304 while remaining within the scope of the present disclosure.

The dummy gate structure 310 may include a dummy gate dielectric over the fins 304 and a dummy gate electrode over the dummy gate dielectric layer (not depicted separately), in some embodiments. The dummy gate structure 310 may optionally include an interfacial layer between the fins 304 and the dummy gate dielectric layer, where the interfacial layer may include an oxide, such as silicon oxide. The gate dielectric layer may include any suitable dielectric material, such as silicon oxide, silicon nitride, multilayers thereof, or the like. The dummy gate electrode may include polysilicon.

Various layers of the dummy gate structure 310 may be deposited as blanket layers over the fins 304 by any suitable process, such as CVD, atomic layer deposition (ALD), or physical vapor deposition (PVD), thermally grown, or chemically grown, and then planarized by a CMP process, for example. A mask layer including silicon nitride or the like may be deposited over the various blanket layers of the dummy gate structure 310. The mask layer may be patterned using a series of photolithography and etching processes to form the mask 312. The pattern of the mask 312 may then be transferred to the blanket layers using any suitable etching processes to form the dummy gate structure 310. The dummy gate structure 310 traverses or covers a portion, e.g., the channel region 311, of the fin 304, where a lengthwise direction of the dummy gate structure 310 (e.g., along the line B-B of FIG. 1) is substantially perpendicular to a lengthwise direction of the fins 304 (e.g., the line A-A of FIG. 1).

Referring to FIGS. 2A and 4, the method 200 subsequently forms a number of lightly doped drain (LDD) regions 314. The LDD regions 314 may be formed by applying a plasma doping process to portions of the fin 304 in the respective device regions. The plasma doping process may include forming a patterned mask (not depicted), such as a patterned photoresist, to cover the regions of the device 300 that are to be protected from the plasma doping process. Portions of the LDD regions 314 may extend under the first dummy gate structure 310 and into the channel region 311. FIG. 5 depicts a non-limiting example of the LDD regions 314. Other configurations, shapes, and formation methods of the LDD regions 314 may also be possible and are fully intended to be included within the scope of the present disclosure. For example, the LDD regions 314 may be formed after gate spacers 320/322, which will be discussed below, are formed. In some embodiments, the LDD regions 314 are omitted from the device 300.

Still referring to FIG. 4, after forming the LDD regions 314 and 316, first gate spacers 320 are formed around (e.g., along and contacting the sidewalls of) the dummy gate structures 310, and second gate spacers 322 are formed around (e.g., along and contacting the sidewalls of) the first gate spacers 320. For example, the first gate spacers 320 may be formed on opposing sidewalls of the dummy gate structure 310, and the second gate spacers 322 may be formed on the first gate spacers 320. It should be understood that any number of gate spacers can be formed around the dummy gate structures 310 while remaining within the scope of the present disclosure.

The first gate spacers 320 may be a low-k (e.g., having a dielectric constant less than that of silicon oxide, which is about 3.9) spacer and may include a suitable dielectric material, such as silicon oxide, silicon oxycarbonitride, the like, or combinations thereof. The second gate spacers 322 may include a suitable dielectric material, such as silicon nitride, silicon oxynitride, silicon carbonitride, the like, or combinations thereof. In accordance with various embodiments, the first gate spacers 320 and the second gate spacers 322 include different materials to provide etching selectivity therebetween in subsequent processing. The first gate spacers 320 and the second gate spacers 322 may be formed by first conformally depositing a dielectric layer over the dummy gate structures 310 using any suitable deposition process, such as thermal oxidation, CVD, or the like, and subsequently removing portions of the dielectric layer using a suitable etching process (e.g., a directional or anisotropic dry etching process), leaving behind the first gate spacer 320 and the second gate spacer 322 along the sidewalls of the dummy gate structures 310. The first gate spacer 320 and the second gate spacer 322 may sometimes be collectively referred to as gate spacers 320/322.

Referring to FIGS. 2A, 4, 6, and 7, the method 200 at operation 210 forms first source/drain features 330 in the fins 304. In the present embodiments, the source/drain features 330 may include silicon germanium (SiGe) doped with a P-type dopant, such as B, In, the like, or combinations thereof, configured to form a P-type device (e.g., PFET). Alternatively, the source/drain features 330 may include silicon (Si) or silicon-carbon (SiC) doped with an N-type dopant, such as P, As, the like, or combinations thereof, configured to form an N-type device (e.g., NFET).

The source/drain features 330 may be formed by first etching the fins 304 to form recesses (not depicted) adjacent to each dummy gate structure 310 by any suitable etching process, such as a dry etching process. For example, the recesses may be formed by an anisotropic dry etching process using the dummy gate structures 310 as an etching mask. Then, the source/drain features 330 are formed in the recesses by epitaxially growing a semiconductor material (e.g., Si, SiC, or SiGe) from the fins 304 exposed in the recesses, using any suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof. The resulting source/drain features 330 are alternately arranged with their corresponding dummy gate structures 310, where each dummy gate structure 310 is interposed between a pair of adjacent source/drain features 330 along the lengthwise direction of each fin 304 (e.g., the line A-A as depicted in FIG. 1).

The source/drain features 330 may have a dopant (e.g., impurity) concentration that varies with positions within source/drain features 330. In some embodiments, the source/drain features 330 are doped in situ while epitaxially growing the semiconductor materials in the recesses. In some embodiments, the source/drain features 330 are doped after epitaxially growing the semiconductor materials in the recesses. An annealing process may be applied after doping the semiconductor materials to activate the impurities.

Figure 6:
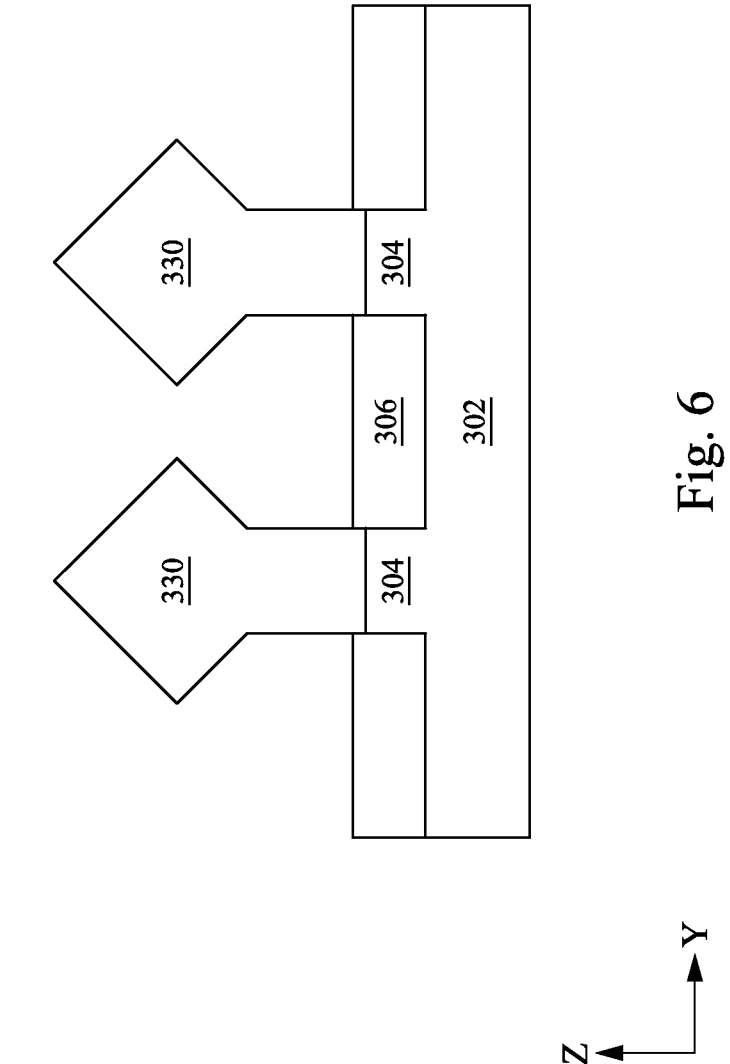
FIGS. 6, 7, 9, 15, 16, 18, 20, 22, 24, 26, 28, 30, 32, 35, and 36 illustrate cross-sectional views of an example semiconductor device, or a portion thereof, analogous to the example semiconductor device of FIG. 1 along line C-C during various fabrication stages of the example method of FIGS. 2A and/or 2B-2C, in accordance with some embodiments of the present disclosure.
Figure 7:
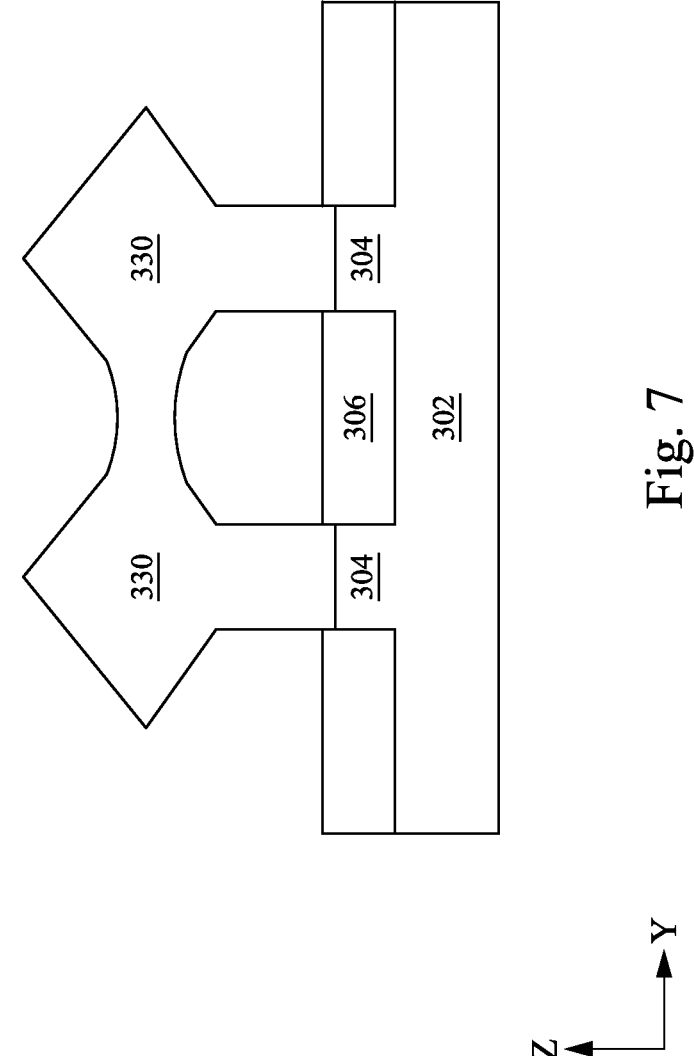

As depicted in FIGS. 4, 6, and 7, the source/drain features 330 may have top surfaces raised from surfaces of the fin 304 (e.g., raised above the non-recessed portions of the fin 304) and may have facets oriented along different crystallographic planes. In some embodiments, the source/drain features 330 extend to below a top surface of the isolation regions 306. In some embodiments, referring to FIG. 6, the source/drain features 330 of the adjacent fins 304 may be separated from one another. In some embodiments, referring to FIG. 7, the source/drain features 330 of the adjacent fins 304 may merge to form a continuous epitaxial source/drain feature. FIGS. 6 and 7 provide non-limiting examples of the shapes of the source/drain features 330. For example, the source/drain features 330 may be configured as cladding source/drain features that are epitaxially grown from upper portions of the fins 304 without recessing the fins 304.

Figure 8:
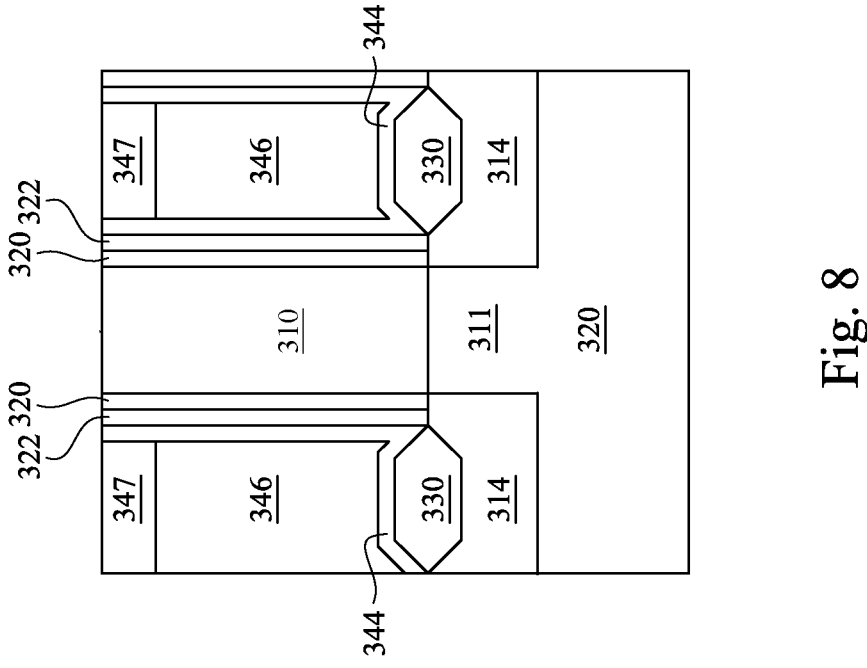
Figure 8:
Figure 8:
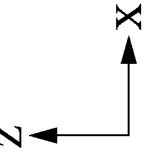
Figure 9:
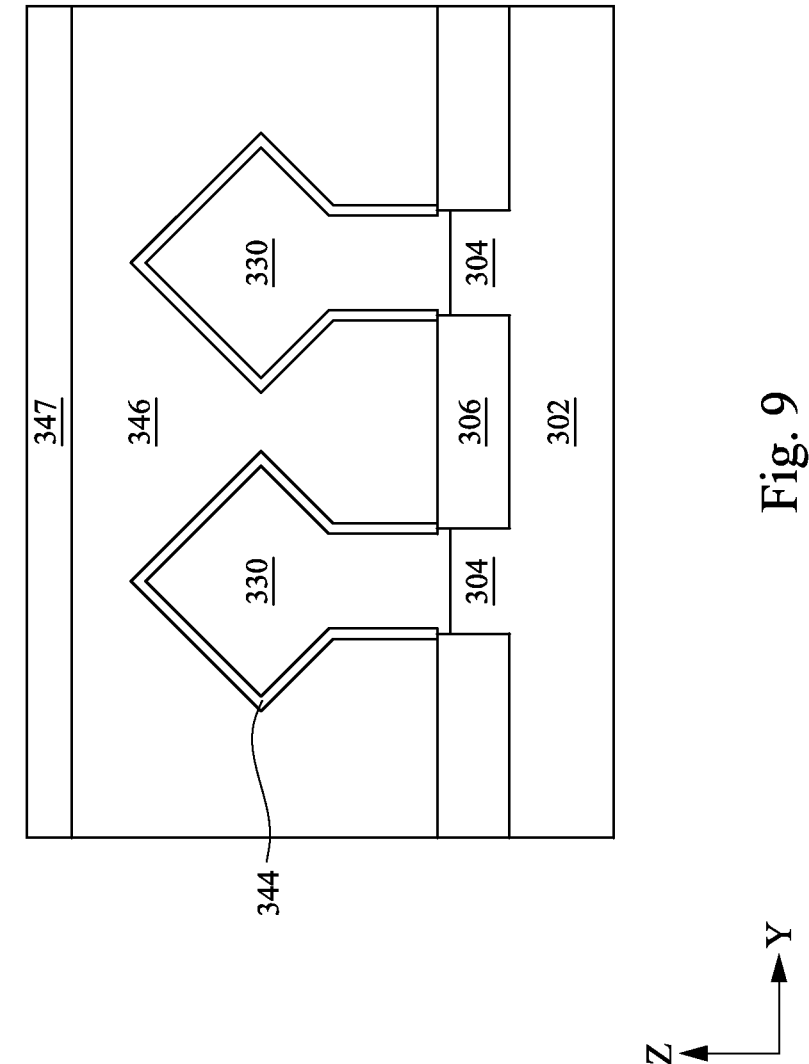

Referring to FIGS. 8 and 9, the method 200 at operation 212 forms an interlayer dielectric (ILD) layer 346 over the source/drain features 330 and adjacent the dummy gate structures 310. In some embodiments, prior to forming the ILD layer 346, a contact etch stop layer (CESL) 344 is formed over the device 300. The ILD layer 346 and CESL 344 include different materials to provide etching selectivity therebetween in subsequent fabrication processes. The CESL 344 may include any suitable dielectric material such as silicon nitride, silicon oxynitride, silicon oxide, the like, or combinations thereof, and may be formed by a suitable formation method such as CVD, ALD, PVD, the like, or combinations thereof.

Next, still referring to FIGS. 8 and 9, the ILD layer 346 is formed over the CESL 344 and over the dummy gate structure 310. In some embodiments, the ILD layer 346 includes any suitable dielectric material, such as silicon oxide, a low-k dielectric material, phosphosilicate glass (PSG), borosilicate glass (BSG), boron-doped phosphosilicate glass (BPSG), undoped silicate glass (USG), the like, or combinations thereof, and may be deposited by any suitable method, such as CVD, PECVD, FCVD, or the like. After the ILD layer 346 is formed, a dielectric layer 347 is formed over the ILD layer 346. The dielectric layer 347 may function as a protection layer to prevent or reduce the loss of the ILD layer 346 in subsequent etching processes. In this regard, the dielectric layer 347 and the ILD layer 346 may include different compositions to enhance the etching selectivity therebetween. The dielectric layer 347 may be formed of a suitable material, such as silicon nitride, silicon carbonitride, the like, or combinations thereof using a suitable method such as CVD, PECVD, FCVD, or the like. After the dielectric layer 347 is formed, a planarization process, such as a CMP process, may be performed to achieve a leveled top surface for the dielectric layer 347. The CMP process may also remove the mask 312 and portions of the CESL 344 disposed over the dummy gate structures 310. After the planarization process, the top surface of the dielectric layer 347 is substantially coplanar with the top surface of the dummy gate structures 310 as depicted herein. In some embodiments, the dielectric layer 347 is omitted, such that the ILD layer 346, after being planarized, is substantially coplanar with the top surface of the dummy gate structures 310.

Referring to FIGS. 2A and 10-13, the method 200 at operation 214 replaces the dummy gate structures 310 with a metal gate structure 360. An example replacement gate process (sometimes referred to as a gate-last process) is performed to replace the dummy gate structure 310 with the metal gate structure 360, which may also be referred to as replacement gate structure or active gate structure.

Figure 10:
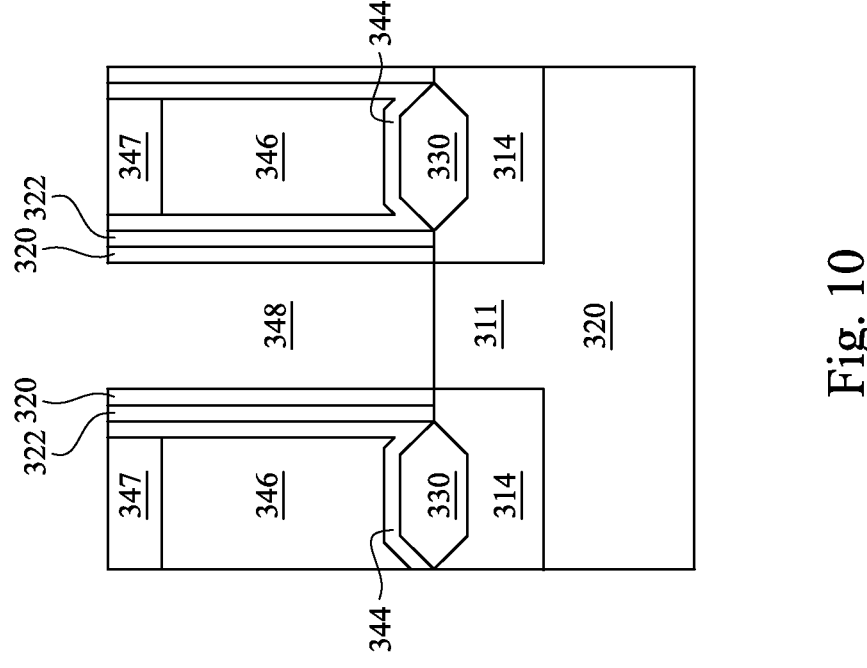
Figure 11:
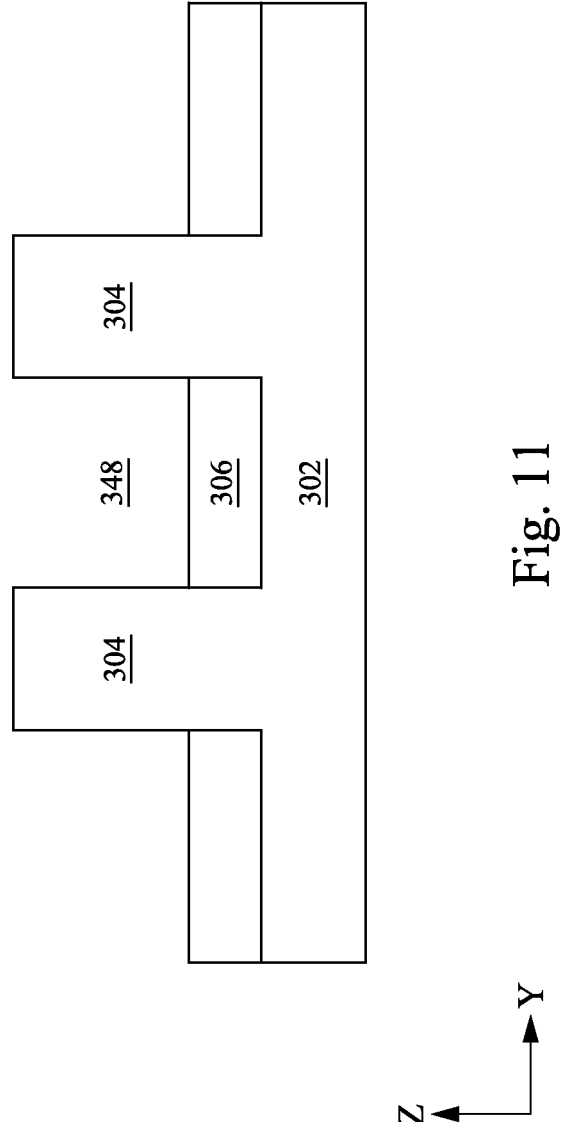
Figure 11:

Referring to FIGS. 10 and 11, the method 200 removes the dummy gate structure 310 to form a gate trench 348. In some embodiments, the dummy gate structure 310 is removed by one or more etching steps between the respective first gate spacers 320 to expose the channel region 311 of the fin 304. In some embodiments, the dummy gate dielectric layer (not depicted) may be used as an etch stop layer when the dummy gate electrode is etched. The dummy gate dielectric layer may then be removed after the removal of the dummy gate electrode. In some examples, top portions of the first gate spacers 320, the second gate spacers 322, or both may be removed (or shortened) by a suitable etching process to expose top portions of the ILD layer 346.

Figure 12:
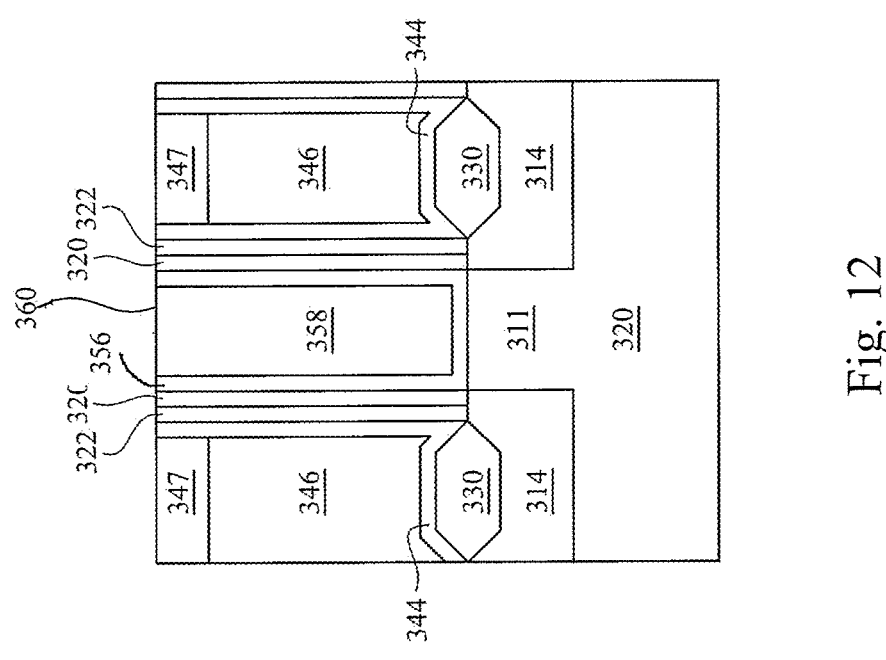
Figure 12:
Figure 12:
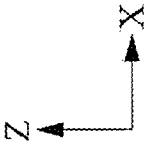
Figure 13:
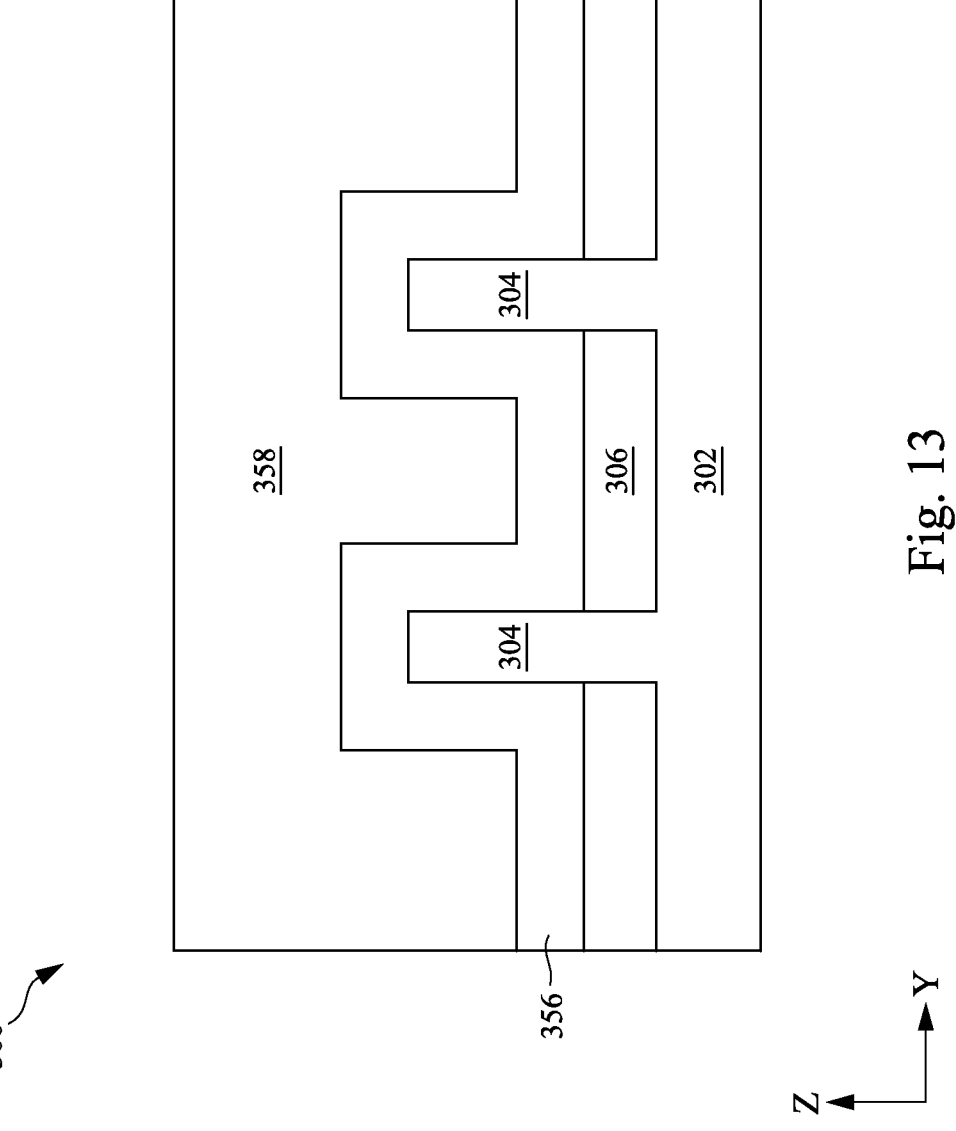

Referring to FIGS. 12 and 13, the method 200 forms the metal gate structure in the gate trench 348. The metal gate structure 360 engages with the source/drain features 330 to form a device, such as an N-type device or a P-type device.

In some embodiments, forming the metal gate structure 360 includes conformally depositing a gate dielectric layer 356 in the gate trench 348 to traverse the channel region 311 and the first gate spacers 320. The gate dielectric layer 356 may include any suitable dielectric material, such as silicon oxide, silicon nitride, a high-k dielectric material (i.e., having a dielectric constant greater than that of silicon oxide, which is about 3.9), the like, or combinations thereof. The high-k dielectric material may include an oxide or a silicate of Hf, Al, Zr, La, Mg, Ba, Ti, Pb, the like, or combinations thereof. The gate dielectric layer 356 may be formed by any suitable method, such as ALD, CVD, PECVD, molecular beam deposition (MBD), the like, or combinations thereof. In some embodiments, an interfacial layer (not depicted) may be formed over the channel region 311 in the gate trench 348 before forming the gate dielectric layer 356. The interfacial layer may include an oxide, such as silicon oxide, and may be formed by any suitable method, such as ALD, CVD, thermal oxidation, chemical oxidation, the like, or combinations thereof.

Subsequently, the method 200 at operation 214 forms a gate electrode 358 over the gate dielectric layer 356, resulting in the metal gate structure 360 in the gate trench 348. The gate electrode 358 may include any suitable metal, such as tungsten (W), copper (Cu), ruthenium (Ru), aluminum (Al), gold (Au), cobalt (Co). The gate electrode 358 may be formed by any suitable method, such as PVD, CVD, electroplating, electroless plating, the like, or combinations thereof, as a blanket layer over the gate dielectric layer 356 and subsequently planarized by a CMP process, for example, to expose a top surface of the first gate spacers 320 and the second gate spacers 322. While not depicted the gate electrode 358 may further include a barrier layer, a seed layer, the like, or combinations thereof. In one example, the barrier layer may include Ti, Ta, TiN, TaN, the like, or combinations thereof, and may be deposited by any suitable method, such as CVD or ALD.

In some embodiments, though not depicted, one or more work function layers may be formed conformally over the gate dielectric layer 356 before forming the gate electrode 358. The work function layers may include a P-type work function layer, an N-type work function layer, multi-layers thereof, or combinations thereof. In the discussion herein, a work function layer may also be referred to as a work function metal. Examples of the work function layers may include TiN, TaN, Ru, Mo, Al, $ZrSi_2$, $MoSi_2$, $TaSi_2$, $NiSi_2$, WN, Ti, Ag, TaAl, TaAlC, TiAlN, TaC, TaCN, TaSiN, Mn, Zr, the like, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, PVD, ALD, the like, or combinations thereof. Additional layers (not depicted) including a capping layer, a glue layer (or an adhesion layer), the like, or combinations thereof may also be formed between the gate dielectric layer

356 and the gate electrode 358 by any suitable method, such as CVD, PVD, ALD, MBD, the like, or combinations thereof. In some embodiments, the capping layer may include silicon, silicon oxide, silicon nitride, the like or combinations thereof. The glue layer may each include Ti, Ta, TiN, TaN, the like, or combinations thereof. In some embodiments, the work function layer(s), the capping layer, the glue layer, and/or the like may each be formed to have a U-shaped configuration over the first silicon oxide layer 350, which is also formed to have a U-shaped configuration.

Figure 14:
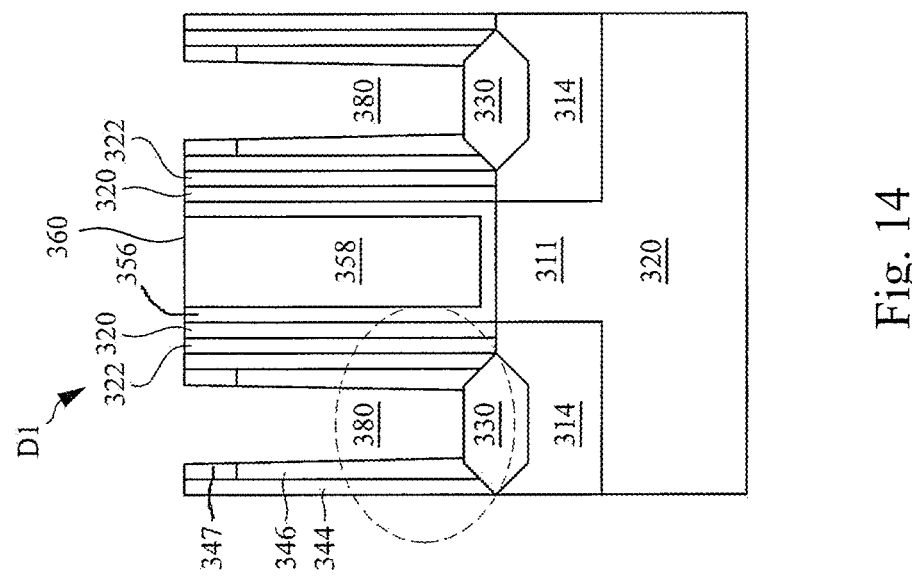
Figure 15:
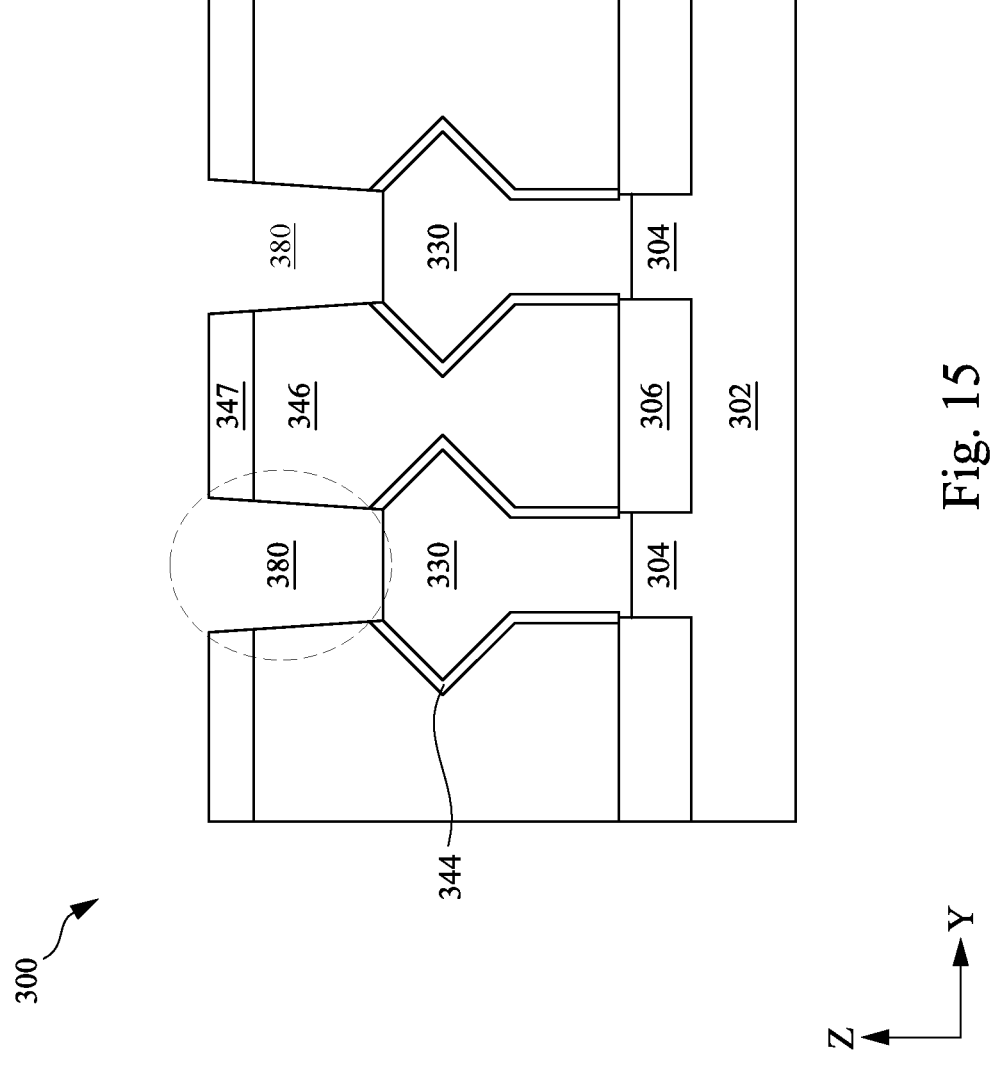

Referring to FIGS. 2A and 14-35 collectively, the method 200 at operation 216 forms a source/drain contact 394 over the source/drain feature 330. In the present embodiments, referring to FIGS. 2B and 2C, the operation 216 is implemented by the method 250. For purposes of clarity, the method 250 is illustrated in reference to a portion of the device 300 within the dashed enclosure as depicted in FIGS. 14 and 15. Specifically, FIGS. 16, 18, 20, 22, 24, 26, 28, 30, 32, and 35 illustrate embodiments of the device 300 in the same view as FIG. 15 (i.e., along line C-C of FIG. 1) during various fabrication stages of the method 250, and FIGS. 17, 19, 21, 23, 25, 27, 29, 31, 33, and 34 illustrate embodiments of the device 300 in the same view as FIG. 14 (i.e., along line A-A of FIG. 1) during various fabrication stages of the method 250.

Referring to FIGS. 2B, 14, and 15, the method 250 at operation 252 forms a contact opening 380 to expose the source/drain feature 330.

Forming the contact opening 380 includes forming a patterned mask (e.g., a patterned photoresist) over the dielectric layer 347 and sequentially etching through the dielectric layer 347, the ILD layer 346, and the CESL 344 using the patterned mask as an etch mask. After patterning the ILD layer 346 and the dielectric layer 347, the patterned mask is removed by any suitable method, such as plasma ashing or resist stripping. In some embodiments, forming the contact opening 380 removes a top portion of the source/drain feature 330 as shown in FIG. 15.

Figures 16, 17:
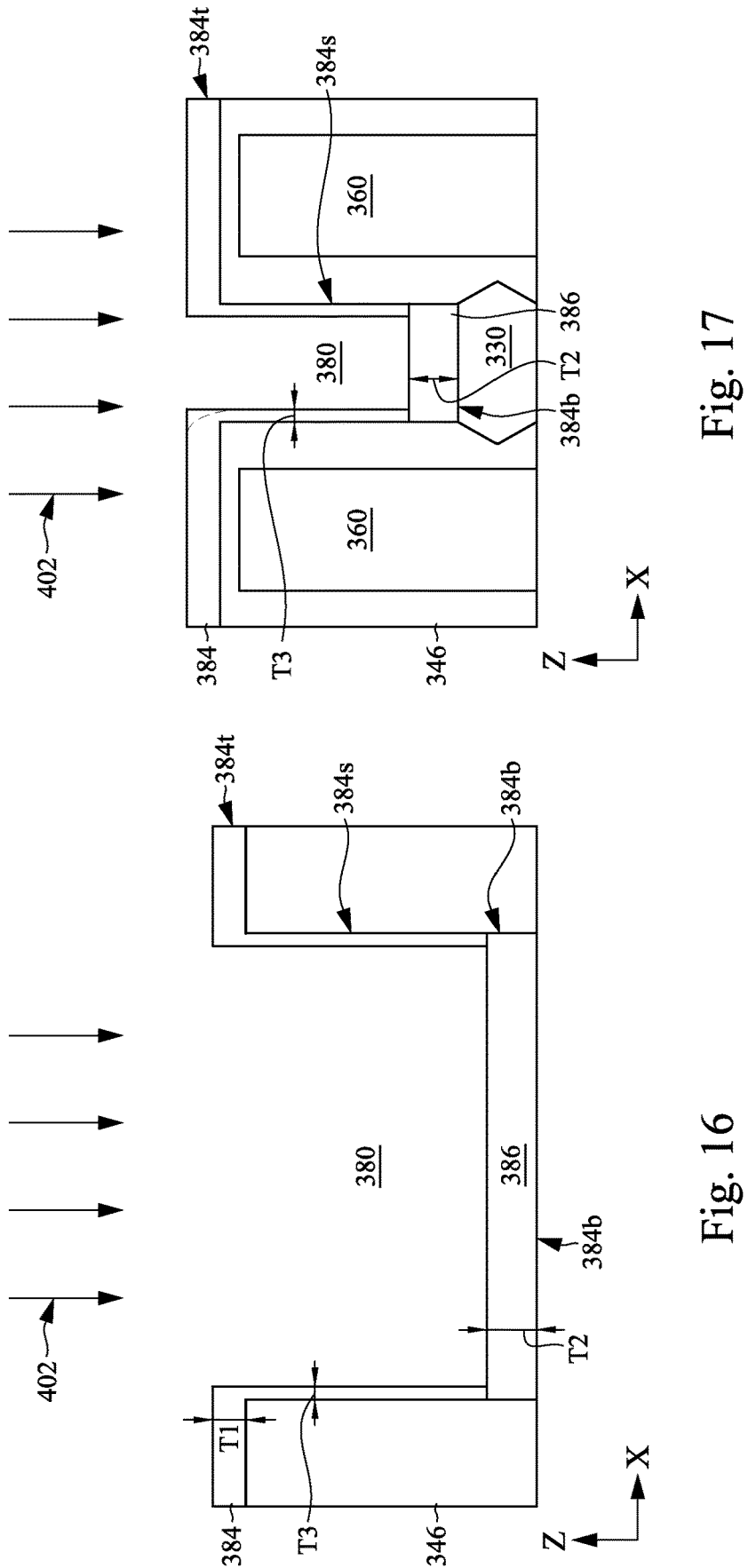

Referring to FIGS. 2B, 16, and 17, the method 250 at operation 254 performs a directional deposition process 402 to form a first metal layer 384 in the contact opening 380, where a portion of the first metal layer 384 subsequently forms a silicide layer 386 over the source/drain feature 330.

The directional deposition process 402 is implemented as a plasma-based CVD process utilizing a plasma source, such as a capacitively coupled plasma (CCP) or an inductively coupled plasma (ICP), to achieve directional deposition. A CCP source generates plasma using a capacitor coupled to a radio-frequency (RF) power supply, while an ICP source generates plasma using an inductor (e.g., coil) using energy produced by electromagnetic induction. An electric field generated between the electrodes can ionize a reactant including, for example, a reaction precursor and/or a reaction gas, provided in the reaction chamber. In operation, the suitable plasma source ionizes a reactant provided to the reaction chamber to generate plasma including charged particles (e.g., ions, electrons, etc.). The charged particles in the reactant accelerate toward a sample affixed in the reaction chamber in a pre-determined direction and form reaction product(s) deposited on surfaces of the substrate corresponding to the pre-determined direction.

In the present embodiments, the directional deposition process 402 selectively forms the first metal layer 384 over horizontal surfaces of the device 300 (e.g., extending along the X-Y plane) with respect to vertical surfaces (e.g., extending along the X-Z plane and Y-Z plane). In other words, the directional deposition process 402 forms a greater amount of the first metal layer 384 over the horizontal surfaces than over the vertical surfaces. As shown in FIGS. 16 and 17, the first metal layer 384, which conformally overlays the contact opening 380 and the ILD layer 346, includes a top portion 384*t* over the ILD layer 346, a bottom portion 384*b* on the source/drain features 330, and a sidewall portion 384*s* along sidewalls of the contact opening 380. In the present embodiments, the top portion 384*t* is formed to a thickness T1, the bottom portion 384*b* is formed to a thickness T2, and the sidewall portion 384*s* is formed to a thickness T3, where T1 and T2 are each greater than T3, and where T2 is greater than T1. Though not depicted, in some examples, T2 may be similar to or the same as T1. In some embodiments, as depicted by dashed curves in FIG. 17, the portion of the first metal layer 384 near top sidewalls of the contact opening 280 has a rounded profile rather than a sharp corner such that a change in thickness from the top portion 384*t* (T1) to the sidewall portion 384*s* (T3) is gradual.

In the present embodiments, the first metal layer 384 includes titanium (Ti), tungsten (W), nickel (Ni), cobalt (Co), molybdenum (Mo), the like, or combinations thereof. In this regard, the directional deposition process 402 is implemented using a reactant that includes a reaction precursor such as $TiCl_4$, $WCl_5$, $MoCl_5$, $Ni(CO)_4$, $Co_2(CO_6)$ [$HCC(C(CH_3)_3)$)], the like, or combinations thereof, and a reaction gas such as hydrogen ($H_2$), argon (Ar), or a combination thereof. Specific composition of the reactant may be selected based on the composition of the first metal layer 384. In some embodiments, the reactant is introduced at a flow of about 10 sccm to about 1000 sccm. The plasma may be generated by the CCP or the ICP source with a power of about 100 W to about 2000 W and a chamber pressure of about 0.1 Torr to about 10 Torr. It is noted that the reactant and processing parameters provided herein are for illustrative purposes only and are not intended to limit the present embodiments as such. Furthermore, although details of the directional deposition process 402 have been described in the context of a plasma-driven reaction, the present disclosure may also utilize a thermally driven reaction without application of plasma to form the first metal layer 384. Still further, in some examples, the directional deposition process 402 may be implemented by a plasma-driven PVD process.

In the present embodiments, the directional deposition process 402 is implemented at elevated temperature, such as from about 300° C. to about 600° C., to allow the bottom portion 384*b* of the first metal layer 384 and a top portion of the underlying source/drain feature 330 to form a metal-containing silicide layer 386. In this regard, the bottom portion 384*b* undergoes a silicidation reaction, resulting in a composition different from that of the top portion 384*t* and the sidewall portion 384*s*.

Subsequently, referring to FIGS. 2B, 18, and 19, the method 250 at operation 256 performs a directional treatment process 404 to the first metal layer 384 and the silicide layer 386, resulting in a barrier layer 388 over the silicide layer 386.

Similar to the operation 254, the directional treatment process 404 is also implemented as a plasma-based CVD process utilizing a CCP plasma source or an ICP plasma source. However, different from the directional deposition process 402, the directional treatment process 404 provides a plasma that includes a non-metal reactant configured to react with the metal included in the first metal layer 384 and at least a portion of the silicide layer 386. In some embodiments, the directional treatment process 404 is implemented in-situ, i.e., with the device 300 remaining in the same reaction chamber after being subjected to the directional deposition process 402 and replacing the metal-containing reaction precursor with a non-metal reactant described in detail below.

Figures 18, 19:
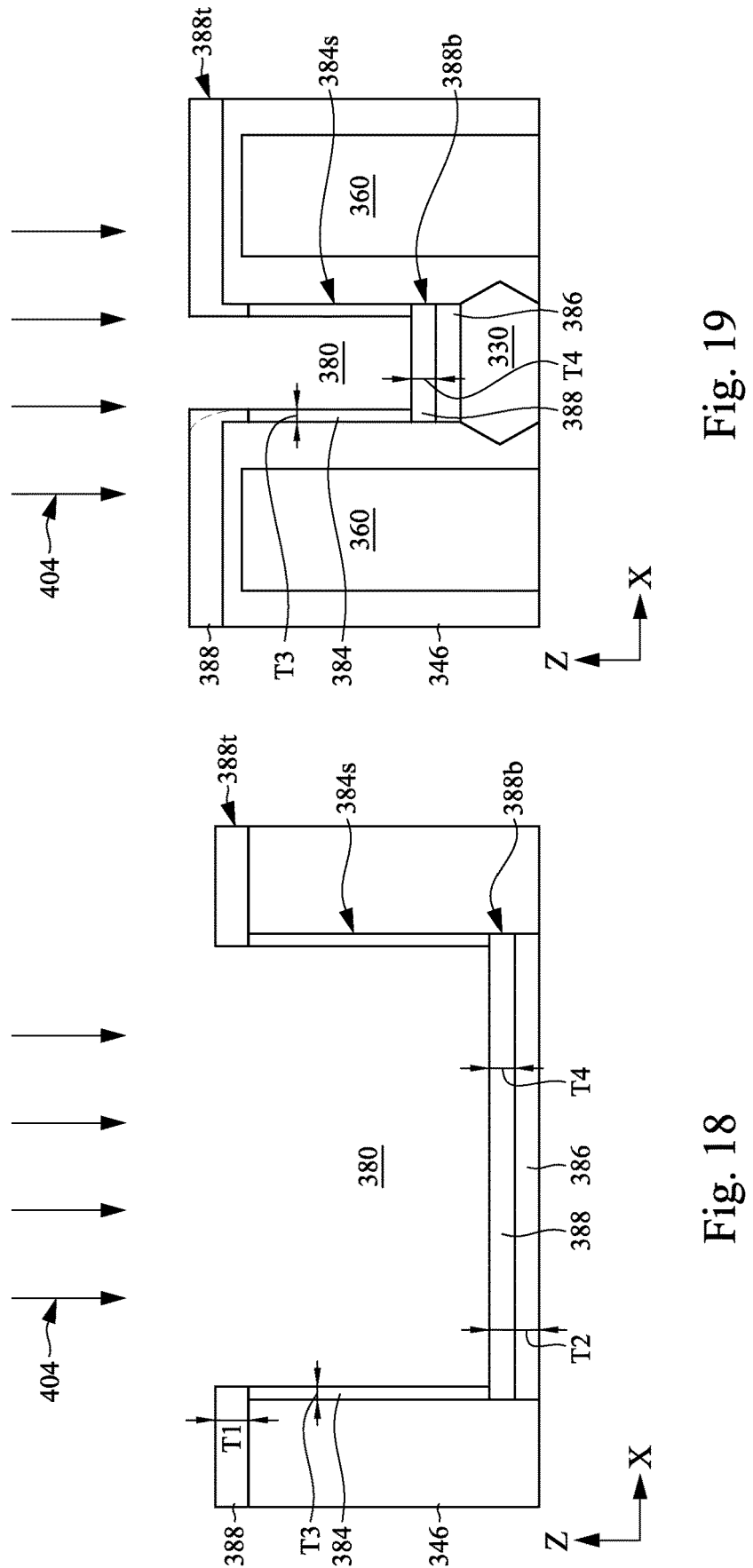

In the present embodiments, referring to FIGS. 18 and 19, the directional treatment process 404 selectively forms the barrier layer 388 over the horizontal surfaces of the device 300 (e.g., extending along the X-Y plane) with respect to vertical surfaces (e.g., extending along the X-Z plane and Y-Z plane). In other words, the directional treatment process 404 forms a greater amount of the barrier layer 388 over the horizontal surfaces than over the vertical surfaces. In the present embodiments, the non-metal reactant reacts with the top portion 384*t* of the first metal layer 384 to form a top portion 388*t* of the barrier layer 388 and also reacts with a top portion of the silicide layer 386 to form a bottom portion 388*b* of the barrier layer 388. In this regard, the top portion 388*t* has the thickness T1, and the bottom portion 388*b* has a thickness T4 that is less than T2. The directional treatment process 404 limits an amount of the non-metal reactant applied to the sidewall portion 384*s* of the first metal layer 384, resulting in little or no barrier layer 388 formed along the sidewalls of the contact opening 380. For embodiments in which the portion of the first metal layer 384 near top sidewalls of the contact opening 280 has a rounded profile rather than a sharp corner, as depicted by the dashed curves in FIG. 19, portions of the barrier layer 388 are also formed along the sidewalls of the contact opening 380 above the sidewall portion 384*s* of the first metal layer 384.

In the present embodiments, the directional treatment process 404 is implemented with a reactant including the non-metal reactant and an inert carrier gas. The non-metal reactant may include a nitrogen-containing gas, such as nitrogen ($N_2$), ammonia ($NH_3$), hydrazine ($N_2H_4$), the like, or combinations thereof, and the inert carrier gas may include Ar. In this regard, the directional treatment process 404 is considered a nitridation process and the resulting barrier layer 388 includes a metal nitride, where the metal of the metal nitride is obtained from the first metal layer 384 (and the silicide layer 386). For example, the metal nitride may include, Ti, W, Ni, Co, Mo, the like, or combinations thereof. In some embodiments, the non-metal precursor is introduced at a flow of about 50 sccm to about 1000 sccm. The plasma may be generated by the CCP or the ICP source with a power of about 100 W to about 5000 W and a chamber pressure of about 0.5 Torr to about 30 Torr. It is noted that the reactant and processing parameters provided herein are for illustrative purposes only and are not intended to limit the present embodiments as such.

The directional treatment process 404 chemically modifies portions of the first metal layer 384 (e.g., the top portion 384*t*) and the silicide layer 386 that extend along the horizontal surfaces of the device 300 without modifying, or substantially modifying, portions of the first metal layer 384 (e.g., the sidewall portions 384*s*) that extend along vertical surfaces. Such selective modification increases a difference in material composition, and thus an etching selectivity, between material layers on the bottom of the contact opening 380 and those along the sidewalls, thereby improving the selective removal of the material layers along the sidewalls with respect to those on the bottom of the contact opening 380. In this regard, other non-metal reactant may also be used during the directional treatment process 404, so long as the resulting composition of the barrier layer 388 is suitable for the intended application of the device 300. Non-limiting examples of the non-metal reactant include chlorine (Cl), carbon (C), and oxygen (O), or combinations thereof, and the directional treatment process 404 implements a chlorination process, a carbonization process, an oxidation process, respectively.

Figures 20, 21:
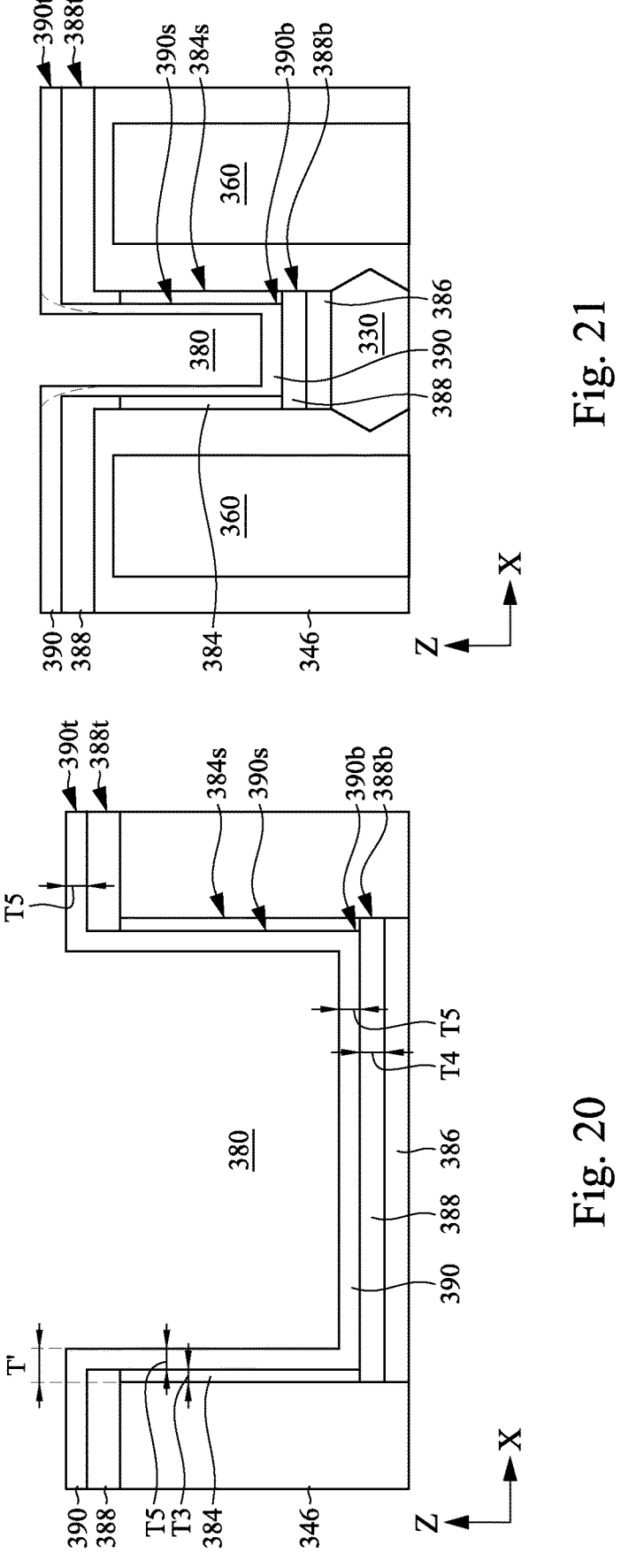

Referring to FIGS. 2B, 20, and 21, the method 200 at operation 258 deposits a second metal layer 390 over the barrier layer 388.

In the present embodiments, the second metal layer 390 includes a seed layer for the subsequently-formed source/drain contact 394 and therefore has a composition consistent with the composition of the source/drain contact 394. The second metal layer 390 is formed conformally over the contact opening 380 by any suitable process, such as a PVD process. In the present embodiments, the second metal layer 390 is not formed by a directional deposition process, such as the directional deposition process 402. Accordingly, the second metal layer 390 includes a top portion 390*t*, a bottom portion 390*b*, and a sidewall portion 390*s* each formed to a substantially uniform thickness T5 over the top portion 388*t*, the bottom portion 388*b*, and the sidewall portion 384*s*, respectively. In an example embodiment, the second metal layer 390 may include a W-containing seed layer deposited by a PVD process. The second metal layer 390 may include other metals, such as Cu. Other suitable metals may also be included the second metal layer 390. In the present embodiments, a total thickness T' of the material layers over the sidewalls of the contact opening 380 accounts for the thicknesses of the sidewall portions 384*s* and 390*s* and is approximately a sum of T3 and T5 as shown in FIG. 20.

Referring to FIGS. 2B, 2C, and 22-29, the method 200 at operations 260-266 performs a series of deposition and etching processes, termed collectively a coating and etching pull-back (CEPB) process, to selectively remove the material layers extending along the sidewalls of the contact opening 380 without removing, or substantially removing, those extending along the bottom of the contact opening 380. In the present embodiments, the CEPB process is configured to remove most (or all) of the sidewall portions 390*s* and 384*s* of the second metal layer 390 and the first metal layer 384, respectively, while the bottom portions 390*b* and 388*b* and the silicide layer 386 remain, or substantially remain, in the contact opening 380.

Figures 22, 23:
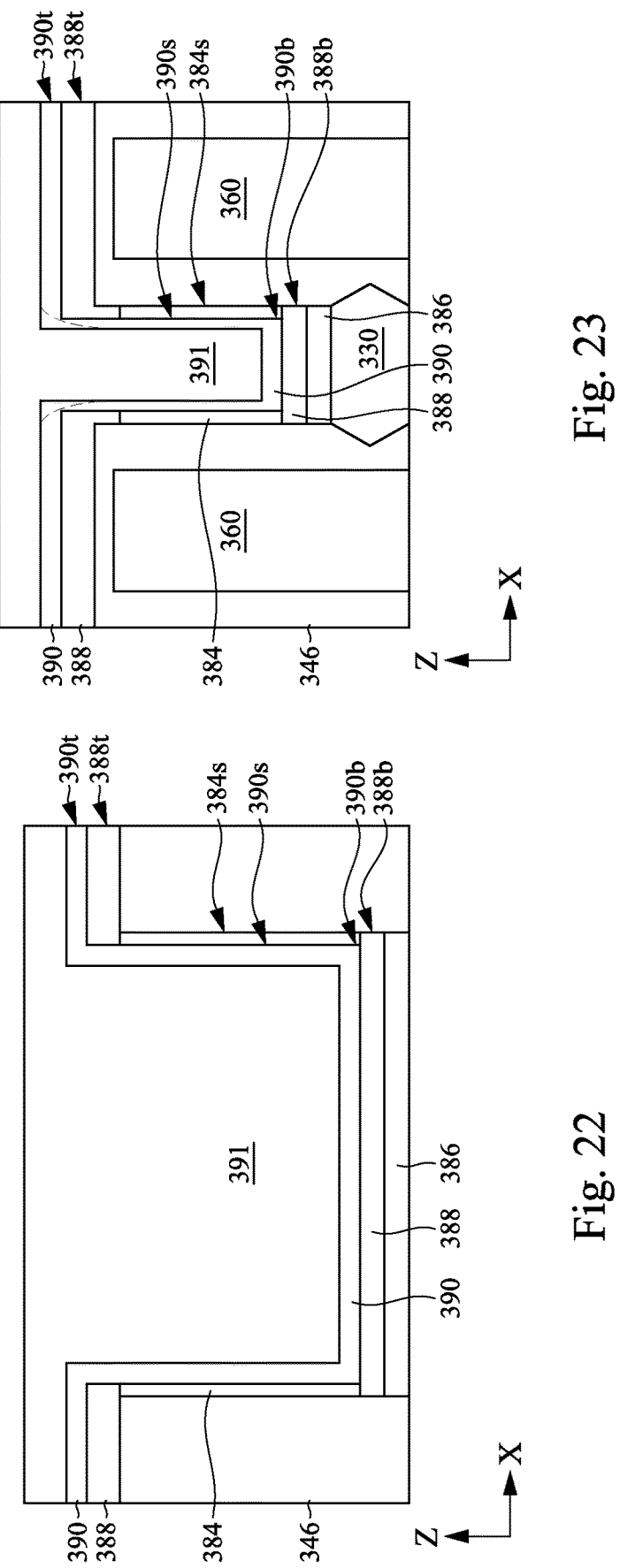

Referring to FIGS. 2B, 22 and 23, the method 200 at operation 260 deposits a polymeric layer 391 over the second metal layer 390 to fill the contact opening 380.

The polymeric layer 391 includes a carbon-based organic material, such as a bottom anti-reflective coating (BARC) material, that exhibits etching selectivity with respect to its surrounding material layers including the second metal layer 390, for example. As such, the polymeric layer 391 can be selectively removed without removing, or substantially removing the surrounding material layers. The polymeric layer 391 may be deposited by any suitable method, such as spin coating, CVD, FCVD, the like, or combinations thereof. In some embodiments, portions of the polymeric layer 391 are formed over a top surface of the ILD layer 346 as depicted in FIGS. 22 and 23.

Figures 24, 25:
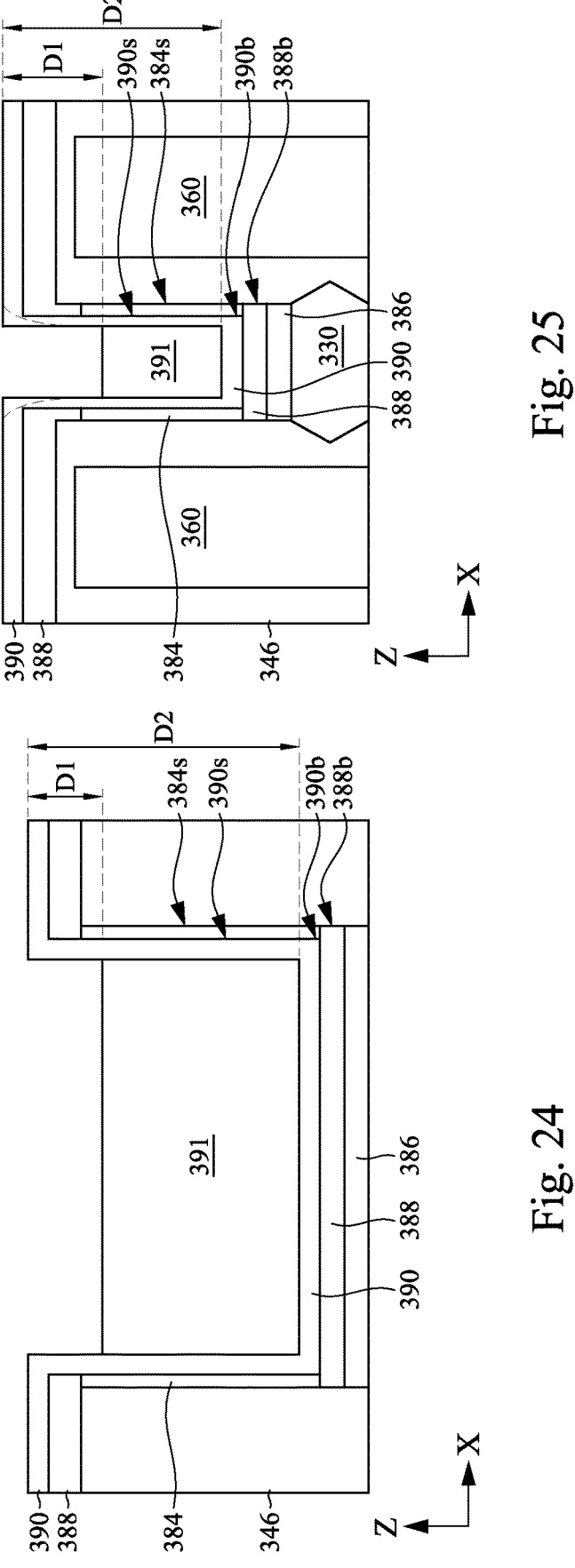

Referring to FIGS. 2C, 24, and 25, the method 200 at operation 262 removes a top portion of the polymeric layer 391 to expose top sidewall portions of the second metal layer 390.

In some embodiments, the polymeric layer 391 is removed using a process suitable for removing photoresist layers. For example, the top portion of the polymeric layer 391 may be removed by plasma ashing, resist stripping, the like, or combinations thereof. The plasma ashing process may be implemented using a fluorine-containing gas, such as $CF_4$, oxygen ($O_2$), nitrogen ($N_2$), $H_2$, the like, or combinations thereof. In the present embodiments, removing the polymeric layer 391 does not remove, or substantially remove, portions of the second metal layer 390 due to the etching selectivity between the polymeric layer 391 and the second metal layer 390.

In some embodiments, removing the top portion of the polymeric layer 391 is controlled by adjusting the duration of the removal process. For example, a depth D1 corresponding to the removed top portion of the polymeric layer 391 increases as the duration of the etching process increases. In some examples, a ratio of the depth D1 to a total thickness (or depth) D2 of the polymeric layer 391 may be less than about 0.5, though the present embodiments are not limited as such.

Figures 26, 27:
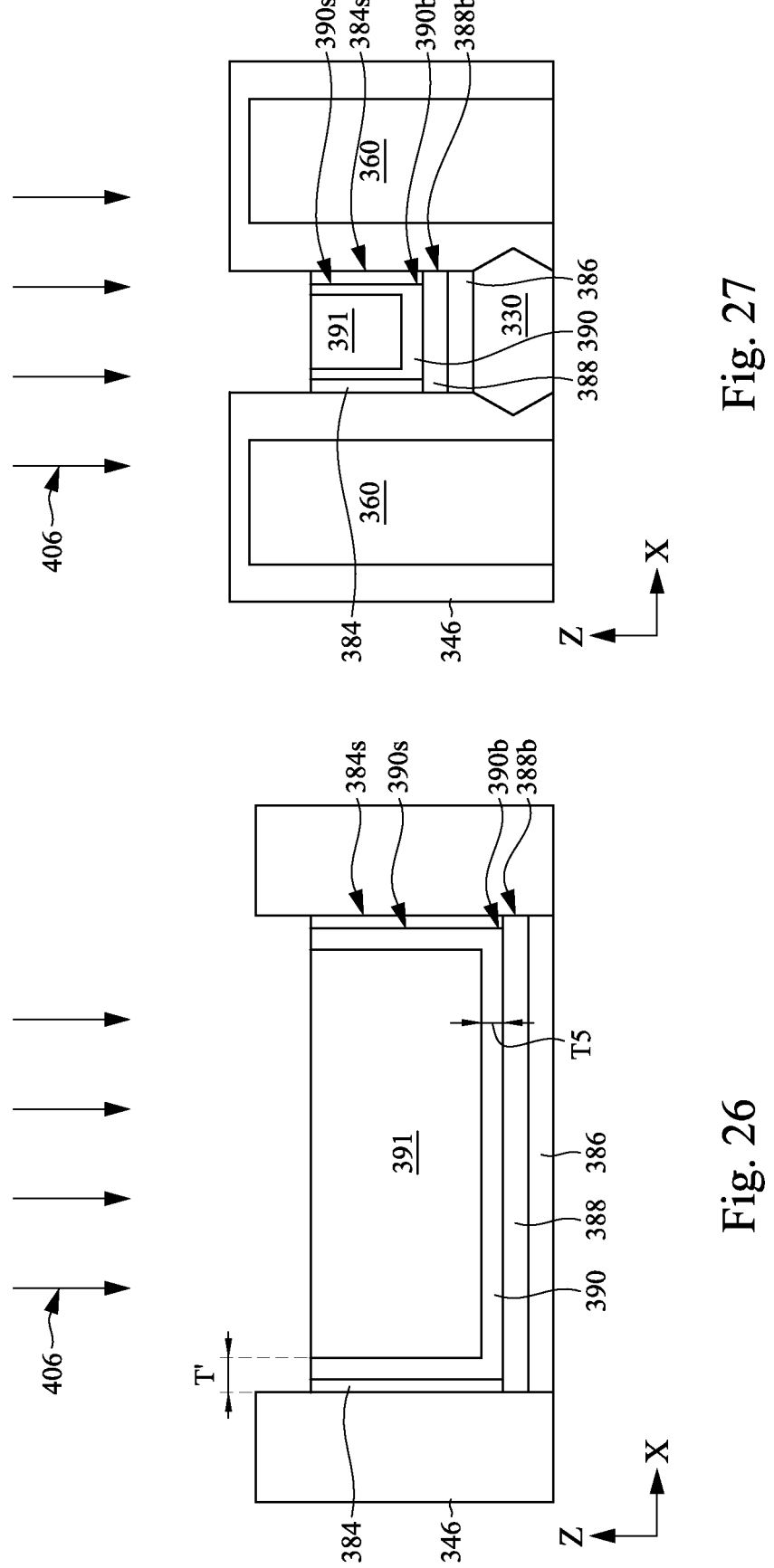

Referring to FIGS. 2C, 26, and 27, the method 250 at operation 264 removes top sidewall portions of the first metal layer 384 and the second metal layer 390 exposed in the contact opening 380.

In some embodiments, the top sidewall portions of the first metal layer 384 (e.g., the sidewall portion 384*s*) and the second metal layer 390 (e.g., the sidewall portion 390*s*) are removed by an etching process 406, such as a conformal wet etching process. In the present embodiments, the etching process 406 is selective and does not remove, or substantially remove, portions of the polymeric layer 391. The etchant utilized for the etching process 406 may include hydrochloric acid (HCl), ozonated deionized water ($DIO_3$ water), sulfuric acid ($H_2SO_4$), the like, or combinations thereof. In some embodiments, the top portion 390*t* of the second metal layer 390 and the top portion 388*t* of the barrier layer 388 are also removed by the etching process 406.

Figures 28, 29:
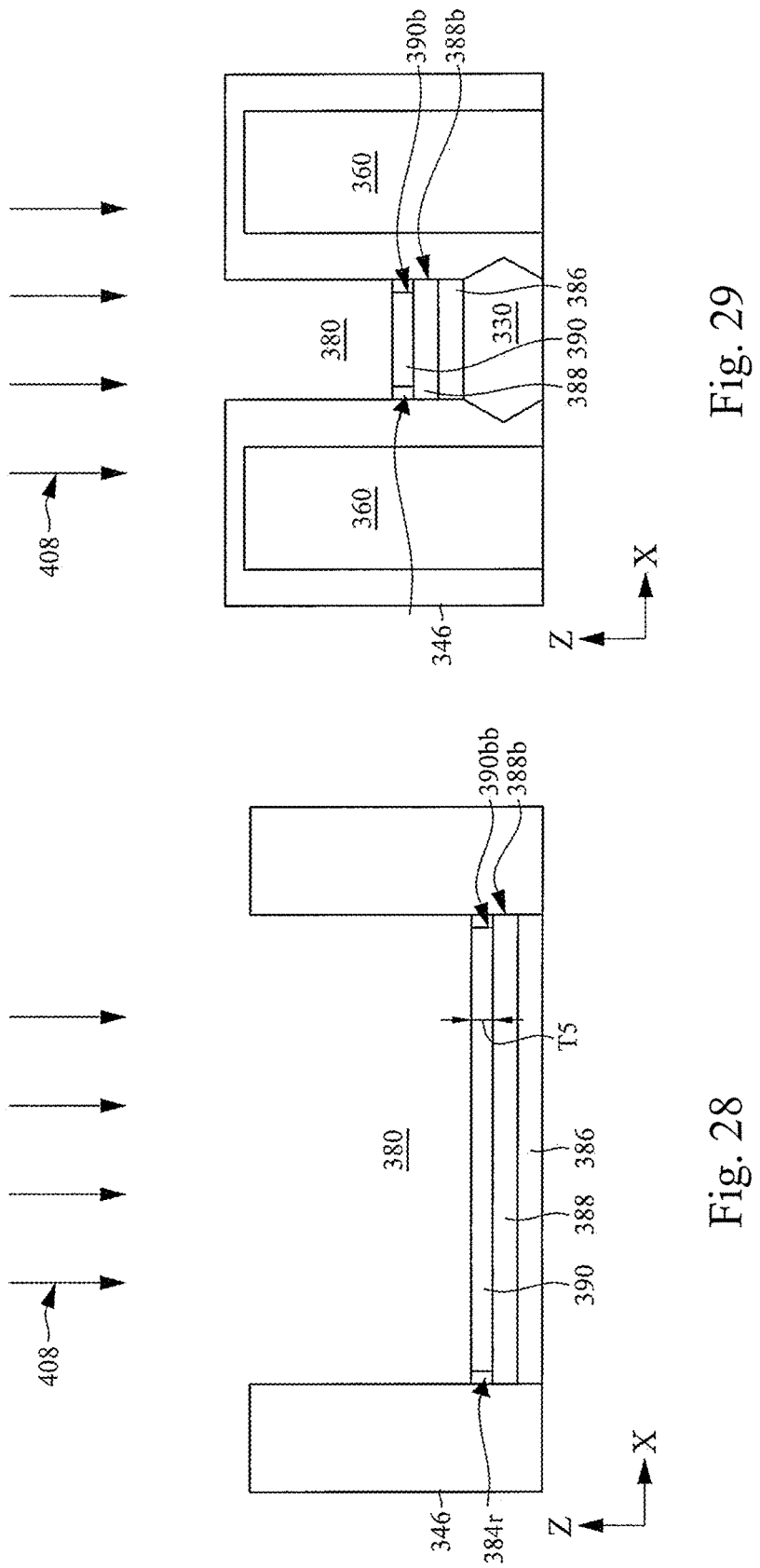

Subsequently, referring to FIGS. 2C, 28, and 29, the method 250 at operation 266 removes remaining portions of the polymeric layer 391 and bottom sidewall portions of the first metal layer 384 and the second metal layer 390, thereby re-exposing the sidewalls of the ILD layer 346 in the contact opening 380.

The remaining portion of the polymeric layer 391 may be removed using the same process as that of the operation 262. For example, the polymeric layer 391 may be removed by a plasma ashing process utilizing at least a fluorine-containing gas. Due to the etching selectivity between the polymeric layer 391 and the second metal layer 390, the removal of the polymeric layer 391 stops on the bottom portion 390*b* of the second metal layer 390. After removing the remaining portion of the polymeric layer 391, the sidewall portion 390*s* of the second metal layer 390 is exposed in the contact opening 380.

Thereafter, the remaining sidewall portions of the second metal layer 390 and the first metal layer 384 are removed from the contact opening 380 using an etching process 408, which is similar to the etching process 406 implemented at the operation 264. For example, the remaining sidewall portions of the second metal layer 390 and the first metal layer 384 may be removed by a conformal wet etching process utilizing an etchant including HCl, DIO3 water, H2SO4, the like, or combinations thereof. In some embodiments, after removing the remaining sidewall portions of the second metal layer 390 and the first metal layer 384, portions 384*r* of the first metal layer 384 remain between a sidewall of the remaining portion of the second metal layer 390 (i.e., the bottom portion 390*bb*, discussed in detail below) and an adjacent sidewall of the ILD layer 346. In this regard, sidewalls of the first metal layer 384 (i.e., the remaining portion 384*r*), the barrier layer 388 (i.e., the bottom portion 388*b*), and the silicide layer 386 are vertically aligned (along the Z axis) along a sidewall of the ILD layer 346.

In some embodiments, the etching process 408 is stopped (i.e., end-point controlled) when the remaining portions of the material layers, such as second metal layer 390 and the first metal layer 384, are removed from the sidewalls of the contact opening 380. In this regard, if the total thickness T' (see FIGS. 20 and 26) of all the material layers over the sidewalls of the contact opening 380 (or the sidewalls of the ILD layer 346) is too large, then completely removing such material layers by the etching process 408 may cause the bottom portion 390bb to be too thin or, in some instances, inadvertently remove the bottom portion 390bb altogether. On the other hand, if the etching process 408 is configured such that the bottom portion 390bb is preserved, then the material layers over the sidewalls may not be completely removed. Any remaining material layers over the sidewalls of the contact opening 380 may result in structural issues, such as voids and reduced grain size, formed in a metal layer subsequently formed for the source/drain contact (e.g., the source/drain contact 394), leading to increased contact resistance of the source/drain contact and loss in the yield of the performance of the device 300.

Accordingly, to achieve more complete removal of the material layers over the sidewalls of the contact opening 380 without causing substantial loss of the material layers over the bottom of the contact opening 380, the present disclosure provides methods of reducing or limiting the total thickness T' by performing both the directional deposition process 402 and the directional treatment process 404. If a non-directional deposition process, rather than the directional deposition process 402, was performed, then the sidewall portion 384s of the first metal layer 384 would have a thickness greater than T3. Furthermore, if a uniform deposition process, rather than the directional treatment process 404, was performed, the barrier layer 388 would be formed between the first metal layer 384 and the second metal layer 390 (having the thickness T5 in FIG. 20) along the sidewalls of the contact opening 380, and the total thickness T' of the material layers would exceed the sum of T3 and T5. In this regard, the total thickness T' may be too large to be completely removed by the etching process 408, leading to structural issues in the subsequently-formed source/drain contact as described above.

Figures 30, 31:
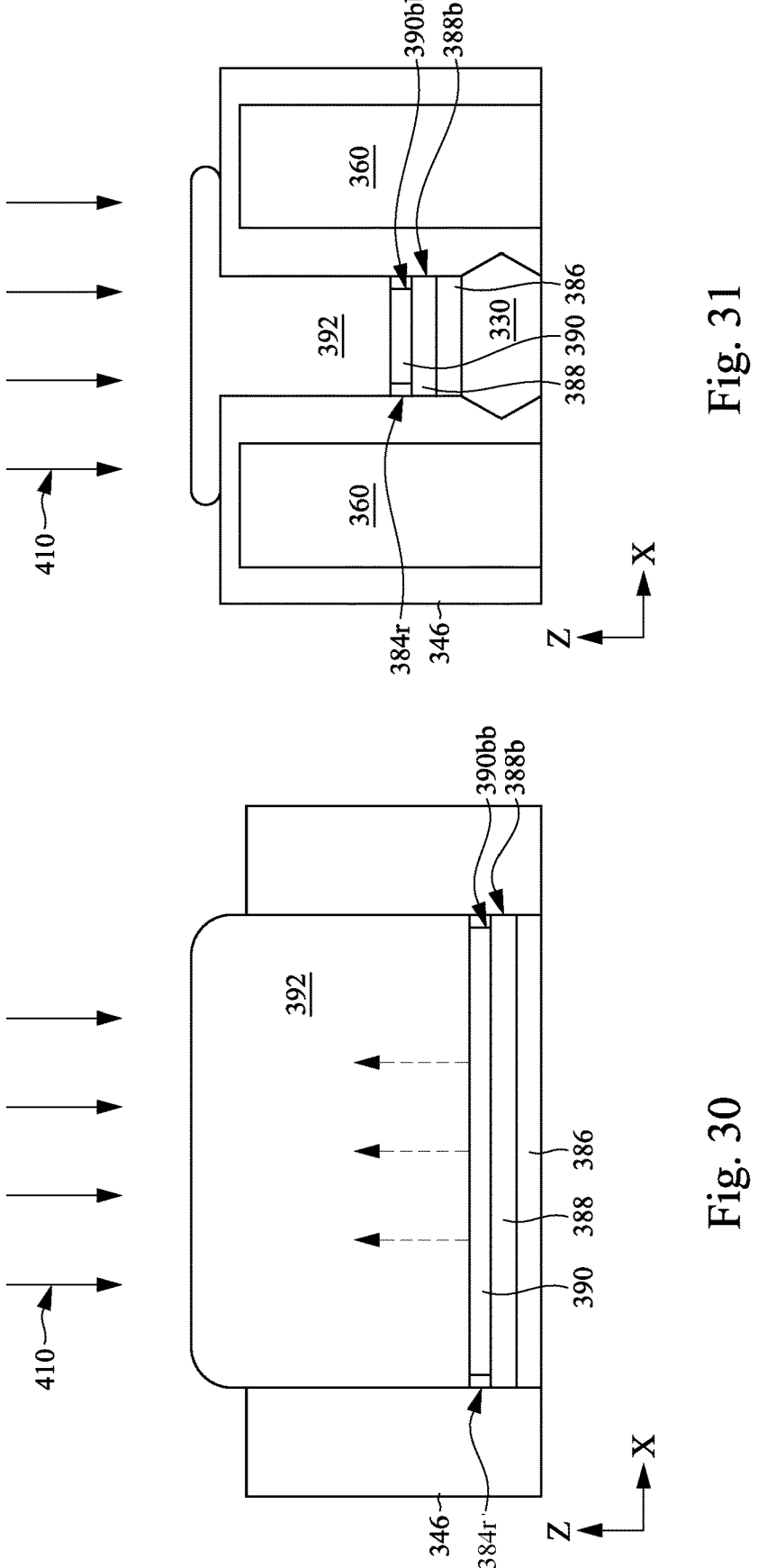

Referring to FIGS. 2C, 30, and 31, the method 250 at operation 268 performs a selective deposition process 410 to form a third metal layer 392 in the contact opening 380.

The selective deposition process 410 may be implemented using a PVD process during which the third metal layer 392 selectively grows from the second metal layer 390 (i.e., the bottom portion 390bb) but not from the ILD layer 346. In other words, the third metal layer 392 grows in a bottom-up process substantially along the Z axis from the second metal layer 390, as indicated by the dashed arrows in FIG. 30. Accordingly, the selective growth causes the third metal layer 392 to bulge out from the contact opening 380 as depicted in FIG. 30. In some embodiments, a sidewall of the third metal layer 392 directly contacts the ILD layer 346 such that sidewalls of the third metal layer 392, the first metal layer 384 (i.e., the remaining portion 384r), the barrier layer 388, and the silicide layer 386 are vertically aligned (along the Z axis).

The third metal layer 392 may include any suitable metal, such as Ti, W, Ni, Co, Mo, Cu, Ru, Al, the like, or combinations thereof. The third metal layer 392 may be formed by reacting a metal halide precursor with a gas, such as H2. In an example embodiment, the third metal layer 392 includes W and is formed by reacting tungsten chloride (WCl5) or tungsten fluoride (WF6) with H2 in a PVD chamber.

Figures 32, 33:
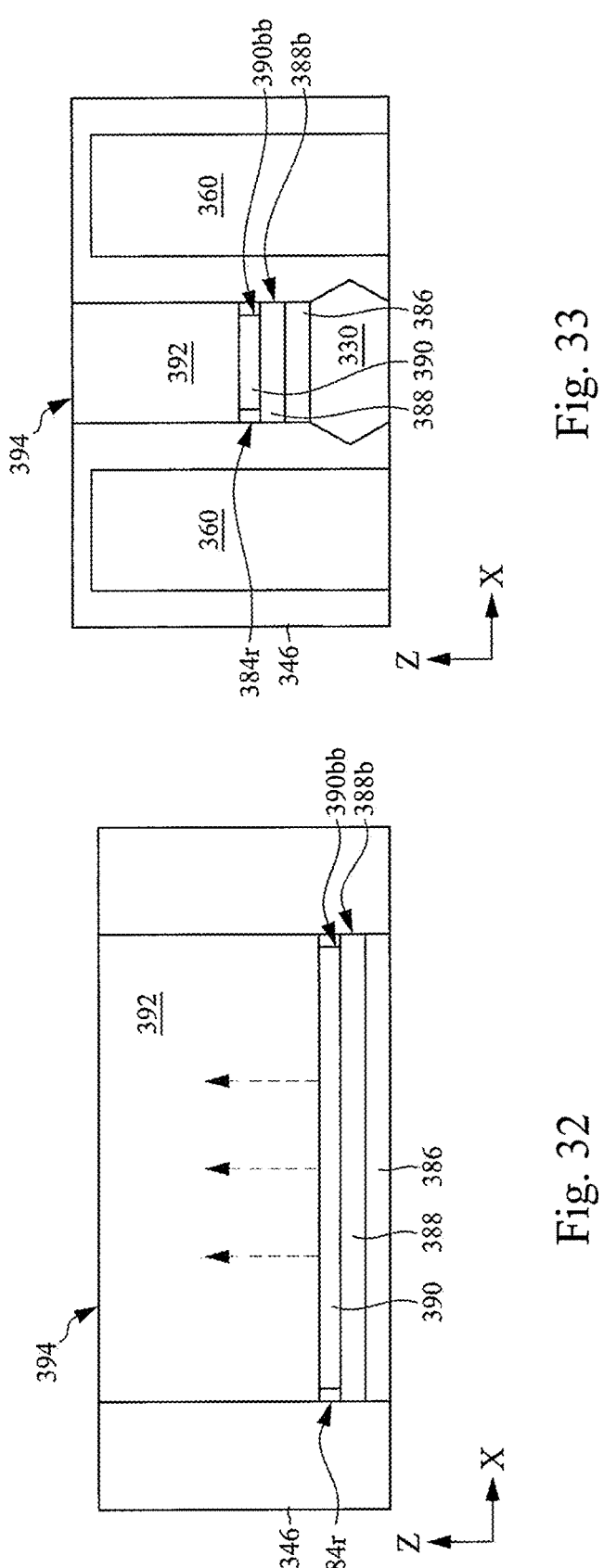

Referring to FIGS. 2C, 32, and 33, the method 250 at operation 270 planarizes the third metal layer 392 to remove the bulged-out portion of the third metal layer 392 and form the source/drain contact 394 in the contact opening 380. The third metal layer 392 may be planarized by any suitable method, such as a CMP process.

Figure 34:
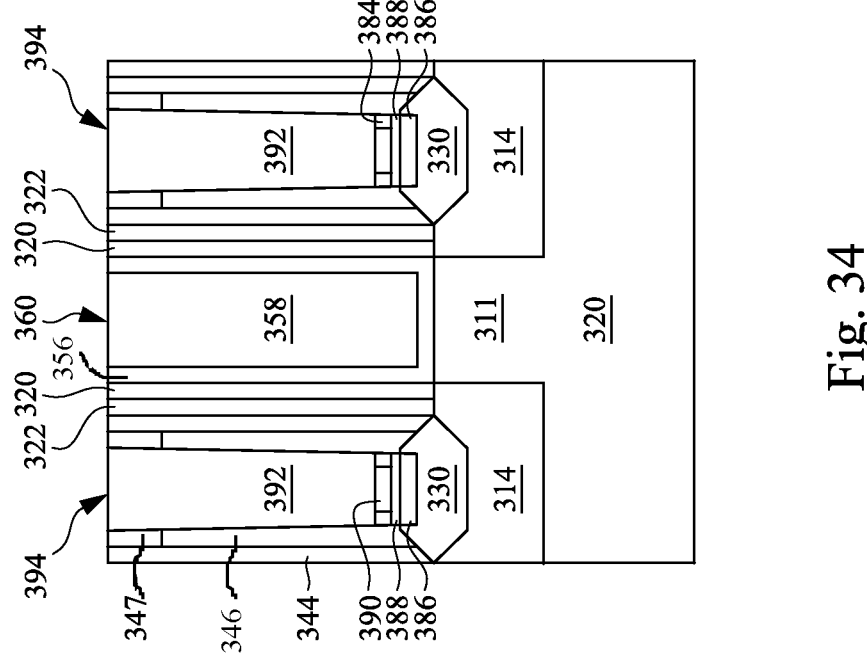
Figure 35:
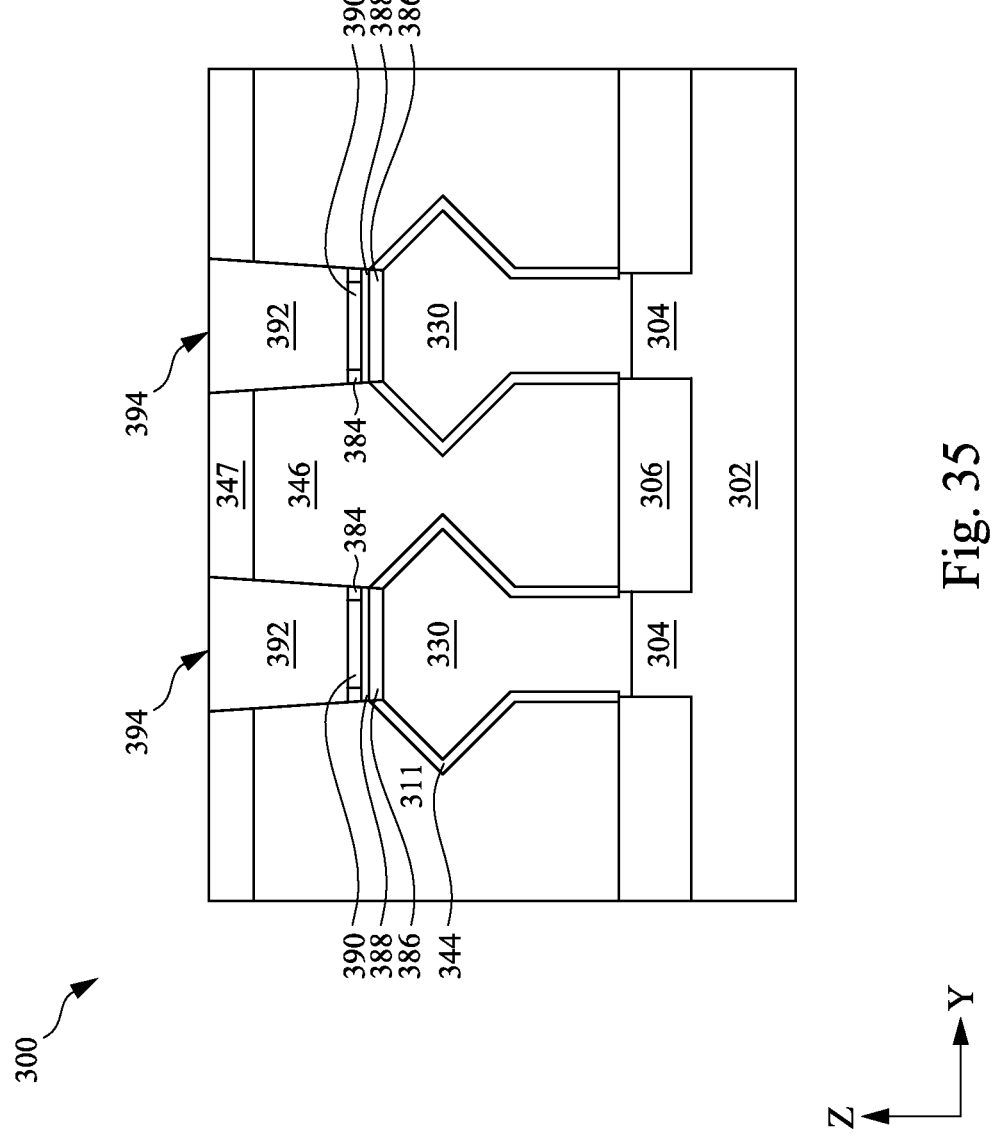
Figure 36:
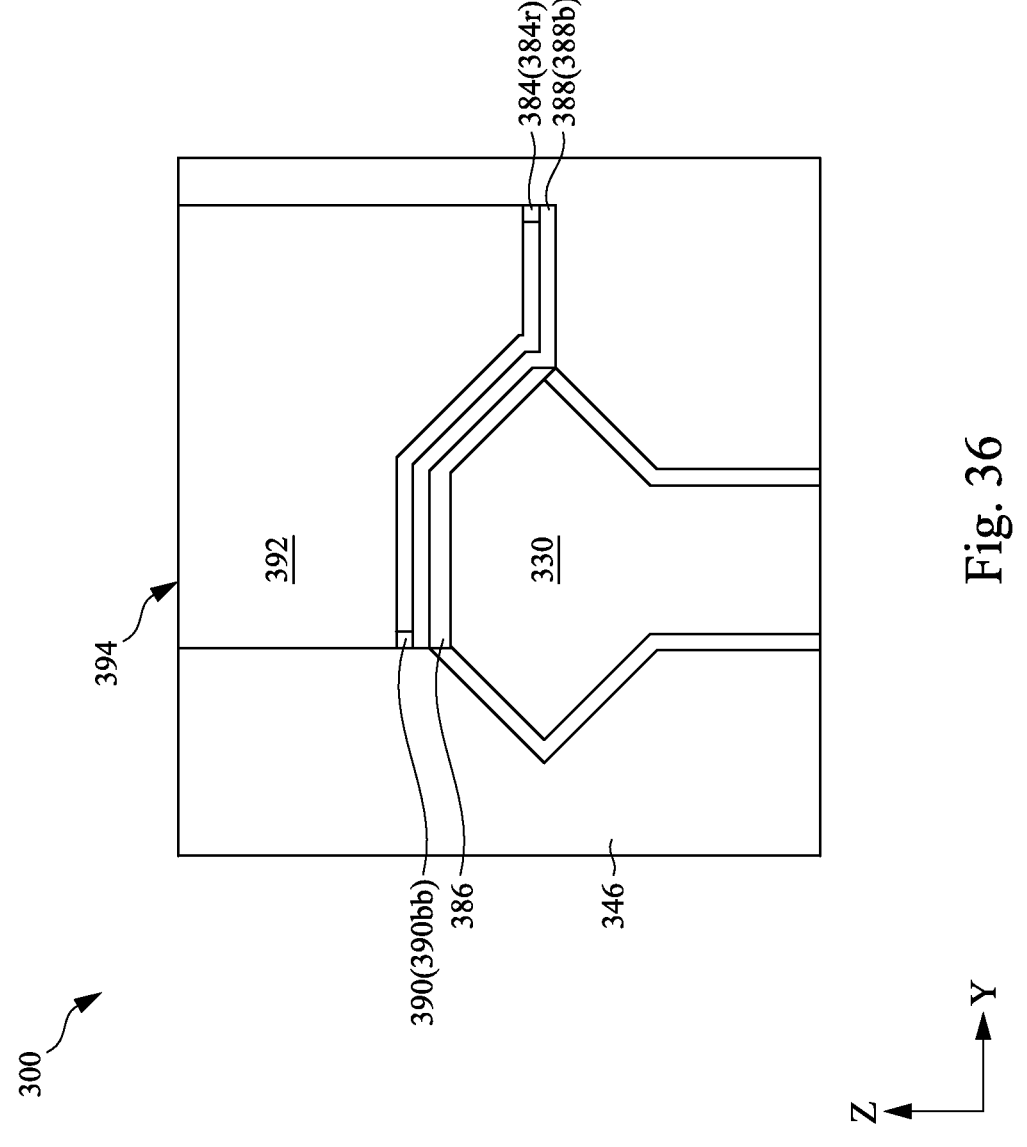

FIGS. 34 and 35 illustrate the device 300 that includes the resulting source/drain contact 394 coupled to the source/drain feature 330. In the present embodiments, the source/drain contact 394 is coupled to the source/drain feature 330 through a plurality of conductive layers including the second metal layer 390 (i.e., the bottom portion 390bb), the barrier layer 388 (i.e., the bottom portion 388b), and the silicide layer 386. Portions 384r of the first metal layer 384 also remain between the second metal layer 390 and the ILD layer 346.

In some embodiments, as shown in FIG. 35, the source/drain contact 394 and the plurality of the conductive layers fully land on the source/drain features 330. In other words, the bottommost portions of the plurality of conductive layers are entirely disposed over the source/drain features 330 and not the ILD layer 346. In some embodiments, referring to FIG. 36, which depicts a portion of the device 300, the source/drain contact 394 and the plurality of conductive layers extend laterally along the Y axis such that the bottommost portions of the plurality of conductive layers are partially disposed in the ILD layer 346. This may be a result of overlay shift occurring during the patterning of the contact opening 380 (e.g., at the operation 252), causing the contact opening 380 to extend laterally into the ILD layer 346. It is noted that the embodiment depicted in FIG. 36 may be formed by the operations 252-270 of the method 250 as described in detail above.

Thereafter, referring back to FIG. 1, the method 200 at operation 218 may perform additional processes to the device 300. For example, interconnect features (e.g., vias and conductive lines) may be formed in various metallization layers (e.g., dielectric layers similar to the ILD layer 346) to electrically couple components of the device 300 with additional features.

The present disclosure provides a semiconductor device (e.g., a FinFET device, a nanosheet transistor device), and a method of forming the same, that includes a selectively forming silicide layer and barrier layer between a source/drain feature and a source/drain contact in a contact opening. In some embodiments, the method includes preforming a directional deposition process to form a metal layer over the source/drain feature, performing a directional treatment process to form a barrier layer in the metal layer, and selectively removing sidewall portions of the metal layer by a series of coating and etching processes. In some embodiments, performing the directional deposition process allows the metal layer to react with the source/drain feature to form a silicide layer. In some embodiments, the directional deposition and treatment processes are each performed using a plasma-driven CVD process. The present disclosure provides methods of reducing or limiting a total thickness of the sidewall portions of the material layers (e.g., the metal layer) in the contact opening by performing both the directional deposition process and the directional treatment process, thereby allowing a more complete removal of portions of the material layers along sidewalls of the contact opening without causing substantial loss of the material layers over the bottom of the contact opening.

According to an aspect of the present disclosure, a method includes forming a semiconductor layer protruding from a substrate. The method includes forming a source/drain feature in the semiconductor layer. The method includes forming a contact opening to expose the source/drain feature. The method includes depositing a first metal layer in the contact opening, the first metal layer having a first portion over the source/drain feature and a second portion along a sidewall of the contact opening. The first portion has a first thickness and the second portion has a second thickness less than the first thickness. The method includes treating the first metal layer to selectively form a barrier layer along the sidewall of the contact opening. The method includes depositing a second metal layer over the barrier layer. The method includes removing portions of the second metal layer, the barrier layer, and the first metal layer along the sidewall of the contact opening. The method further includes forming a source/drain contact over remaining portions of the second metal layer, the barrier layer, and the first metal layer over the source/drain feature.

According to another aspect of the present disclosure, a method includes forming a source/drain feature adjacent a channel region and over a semiconductor substrate. The method includes forming a dielectric layer over the source/drain feature. The method includes forming a contact opening in the dielectric layer to expose the source/drain feature. The method includes performing a directional deposition process to form a first metal layer in the contact opening, where a greater amount of the first metal layer is formed over a bottom surface of the contact opening than along a sidewall surface of the contact opening. The method includes performing a directional treatment process of the first metal layer to form a barrier layer, where a greater amount of the barrier layer is formed over the bottom surface of the contact opening than along the sidewall surface of the contact opening. The method includes depositing a seed layer over the barrier layer. The method includes removing portions of the seed layer and the first metal layer from the sidewall surface of the contact opening to expose the dielectric layer. The method includes depositing a second metal layer over remaining portions of the seed layer, the barrier layer, and the first metal layer over the bottom surface of the contact opening. The method further includes planarizing the second metal layer to form a source/drain contact.

According to yet another aspect of the present disclosure, a semiconductor structure includes a source/drain feature in a semiconductor layer protruding from a substrate. The semiconductor structure includes a dielectric layer over the source/drain feature. The semiconductor structure includes a silicide layer over the source/drain feature. The semiconductor structure includes a barrier layer over the silicide layer. The semiconductor structure includes a seed layer over the barrier layer. The semiconductor structure includes a metal layer between a sidewall of the seed layer and a sidewall of the dielectric layer, a sidewall of each of the silicide layer, the barrier layer, and the metal layer directly contacting the sidewall of the dielectric layer. The semiconductor structure includes a source/drain contact over the seed layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a semiconductor layer protruding from a substrate;

forming a source/drain feature in the semiconductor layer;

forming a contact opening to expose the source/drain feature;

depositing a first metal layer in the contact opening, the first metal layer having a first portion over the source/drain feature and a second portion along a sidewall of the contact opening, wherein the first portion has a first thickness and the second portion has a second thickness less than the first thickness;

treating the first metal layer to selectively form a barrier layer along the sidewall of the contact opening;

depositing a second metal layer over the barrier layer;

removing portions of the second metal layer, the barrier layer, and the first metal layer along the sidewall of the contact opening, comprising:

depositing a polymeric layer over the second metal layer to fill the contact opening; and removing a portion of the polymeric layer to expose top sidewall portions of the second metal layer and the first metal layer; and forming a source/drain contact over remaining portions of the second metal layer, the barrier layer, and the first metal layer over the source/drain feature.

2. The method of claim 1, wherein the depositing of the first metal layer is implemented as a directional deposition process.

3. The method of claim 1, wherein the depositing of the first metal layer causes the first portion of the first metal layer to react with the source/drain feature, thereby forming a metal silicide.

4. The method of claim 1, wherein the treating of the first metal layer is implemented as a directional treatment process.

5. The method of claim 1, wherein the treating of the first metal layer includes applying a nitrogen plasma to react with the first metal layer such that the barrier layer includes a metal nitride.

6. The method of claim 1, wherein the depositing of the second metal layer includes implementing a physical vapor deposition process.

7. The method of claim 1, wherein the forming of the source/drain contact includes:

depositing a third metal layer in a bottom-up process, wherein the third metal layer and the second metal layer include the same metal; and performing a planarization process to the third metal layer, resulting in the source/drain contact.

8. The method of claim 1, wherein the removing includes:

removing the exposed top sidewall portions;

removing a remaining portion of the polymeric layer to expose remaining sidewall portions of the second metal layer and the first metal layer; and performing a wet etching process to remove the exposed remaining sidewall portions.

9. The method of claim 8, wherein the performing of the wet etching process partially removes the remaining portion of the second metal layer over the source/drain feature.

10. A method, comprising:

forming a source/drain feature adjacent a channel region and over a semiconductor substrate;

forming a dielectric layer over the source/drain feature;

forming a contact opening in the dielectric layer to expose the source/drain feature;

performing a directional deposition process to form a first metal layer in the contact opening, wherein a greater amount of the first metal layer is formed over a bottom surface of the contact opening than along a sidewall surface of the contact opening;

performing a directional treatment process of the first metal layer to form a barrier layer, wherein a greater amount of the barrier layer is formed over the bottom surface of the contact opening than along the sidewall surface of the contact opening;

depositing a seed layer over the barrier layer;

removing portions of the seed layer and the first metal layer from the sidewall surface of the contact opening to expose the dielectric layer;

depositing a second metal layer over remaining portions of the seed layer, the barrier layer, and the first metal layer over the bottom surface of the contact opening; and planarizing the second metal layer to form a source/drain contact.

11. The method of claim 10, wherein the performing of the directional deposition process includes implementing a plasma deposition of a metal precursor.

12. The method of claim 11, wherein the plasma deposition is implemented at an elevated temperature capable of causing the first metal layer to react with the source/drain feature to form a silicide layer over the bottom surface of the contact opening.

13. The method of claim 10, wherein the performing of the directional treatment process includes implementing a plasma deposition of nitrogen, resulting in a metal nitride in the barrier layer.

14. The method of claim 10, wherein the removing includes:

forming a polymeric layer to fill the contact opening;

etching a portion of the polymeric layer to expose top sidewall portions of the seed layer and the first metal layer;

etching the exposed top sidewall portions;

etching a remaining portion of the polymeric layer to expose remaining sidewall portions of the second metal layer and the first metal layer; and etching the exposed remaining sidewall portions.

15. The method of claim 10, wherein the depositing of the second metal layer includes selectively forming the second metal layer over the remaining portion of the seed layer with respect to the dielectric layer.

16. A semiconductor structure, comprising:

a source/drain feature in a semiconductor layer protruding from a substrate;

a dielectric layer over the source/drain feature;

a silicide layer over the source/drain feature;

a barrier layer over the silicide layer;

a seed layer over the barrier layer;

a metal layer between a sidewall of the seed layer and a sidewall of the dielectric layer, a sidewall of each of the silicide layer, the barrier layer, and the metal layer directly contacting the sidewall of the dielectric layer; and a source/drain contact over the seed layer.

17. The semiconductor structure of claim 16, wherein the silicide layer and the barrier layer include the same metal.

18. The semiconductor structure of claim 16, wherein the metal layer includes at least one material selected from the group consisting of titanium, tungsten, cobalt, nickel, molybdenum, and combinations thereof.

19. The semiconductor structure of claim 16, wherein the barrier layer includes at least one material selected from the group consisting of nitrogen, carbon, oxygen, and chlorine.

20. The semiconductor structure of claim 16, wherein the barrier layer laterally extends into the dielectric layer.

* * * * *